US005282257A

United States Patent [19]
Ota

[11] Patent Number: 5,282,257
[45] Date of Patent: Jan. 25, 1994

[54] STAR COUPLER AND OPTICAL COMMUNICATION NETWORK

[75] Inventor: Takeshi Ota, Kanagawa, Japan

[73] Assignee: Fuji Xerox Co., Ltd., Tokyo, Japan

[21] Appl. No.: 813,443

[22] Filed: Dec. 26, 1991

[30] Foreign Application Priority Data

| Dec. 28, 1990 | [JP] | Japan | 2-409070 |
| Apr. 26, 1991 | [JP] | Japan | 3-097406 |
| Jun. 21, 1991 | [JP] | Japan | 3-150460 |
| Jun. 28, 1991 | [JP] | Japan | 3-158614 |

[51] Int. Cl.$^5$ ............ G02B 6/28; G02F 1/00
[52] U.S. Cl. ............ 385/46; 385/14; 385/24; 385/45; 385/42; 359/121; 359/178; 359/333; 359/342
[58] Field of Search ......... 385/45, 46, 44, 42, 385/17, 24, 14, 49, 50; 359/120, 121, 333, 341, 342, 345, 346, 174, 178; 372/6

[56] References Cited

U.S. PATENT DOCUMENTS

| 4,457,581 | 7/1984 | Johnson et al. | 385/46 |
| 4,473,271 | 9/1984 | Mitchell | 385/46 |
| 4,708,424 | 11/1987 | Marhic | 385/46 |
| 4,747,651 | 5/1988 | Weismeier | 385/46 X |
| 4,787,693 | 11/1988 | Kogelnik et al. | 385/46 |
| 4,826,275 | 5/1989 | Heinzman | 385/46 |
| 4,836,644 | 6/1989 | Eisenmann et al. | 385/46 |
| 4,863,231 | 9/1989 | Byron et al. | 385/46 |
| 4,867,519 | 9/1989 | Le Roy et al. | 385/24 |
| 5,023,942 | 6/1991 | Goepel | 359/74 X |
| 5,077,817 | 12/1991 | Shang | 372/6 |
| 5,140,655 | 8/1992 | Bergmann | 385/46 |
| 5,166,994 | 11/1992 | Stowe et al. | 385/48 |
| 5,208,885 | 5/1993 | Dragone et al. | 385/49 |
| 5,226,100 | 7/1993 | Maerz | 385/45 |

FOREIGN PATENT DOCUMENTS

58-90843 5/1983 Japan ............ 384/46 X

OTHER PUBLICATIONS

Hiroshi Wada et al., "Planar Waveguide Star Coupler (II)", 963. (1980) Nat. Conv. of IECE of Japan.
Kiyofumi Mochizuki, "Semiconductor Laser Amplifiers", KDD R&D Laboratories, 2-1-23, pp. 297-302. Feb. 1989.
Masaharu Horiguchi, "Optical Fiber Amplifier", NTT Opto-Electronics Laboratories, (1990), pp. 276-282.
Yamasaki et al., "Fabrication Technology in Glass Material", O plus E, Nov. 1984, pp. 71-77.
Shimada et al., "Studies on Semiconductor Laser Amplifiers Used in Communication Systems", O plus E, No. 117, Aug. 1989, pp. 106-111.
Takato et al., "Technology for Fabricating Optical Waveguides Using High Polymers", O plus E, Nov. 1984, pp. 78-83.
Eric G. Rawson, et al., "Fibernet: Multimode Optical Fibers for Local Computer Networks", IEEE Transactions on Communications, vol. Com-26, No. 7, Jul. 1978, pp. 983-990.
Takashi Kurokawa, et al., "Fiber optic sheet formation by selective photopolymerization", Applied Optics, vol. 17, No. 4, 15 Feb. 1978, pp. 646-650.
Eiji Okuda, et al., "Planar gradient-index glass waveguide and its applications to a 4-port branched circuit and star coupler", Applied Optics, vol. 23, No. 11, 1 Jun. 1984, pp. 1745-1748.

(List continued on next page.)

Primary Examiner—Brian Healy
Attorney, Agent, or Firm—Finnegan, Henderson, Farabow, Garrett & Dunner

[57] ABSTRACT

An optical coupler capable of reducing the number of terminals of a star coupler per node and allowing easy expansion of a network configured by star couplers. A star coupler of the invention has a plurality of terminals and allows an optical signal to be inputted to and outputted from a single terminal. The star coupler also has such a transfer characteristic that an input signal to an initially inputted terminal is not distributed as an output signal from the initially inputted terminal but distributed as output signals to its terminals other than the initially inputted terminal.

41 Claims, 33 Drawing Sheets

OTHER PUBLICATIONS

Sadakuni Shimada, "Impact of Erbium-doped amplifiers on optical communication systems", Optics & Photonics News, Jan. 1990, pp. 6–11.

M. J. O'Mahony, "Optical amplifiers and their applications", Phil. Trans R. Soc. Lond. A 329, 143–152 (1989), pp. 143–152.

"Optical Cascase Star Network—A New Configuration for a Passive Distribution System with Optical Collision Detection Capability", by T. Tamura, et al., pp. 61–66, IEEE Journal of Lightwave Technology vol. LT-2, No. 1 Feb. 1984.

"New Transmissive Star Couplers for Full Duplex Channels", Electron Letters, vol. 22, No. 6, pp. 332–334, Mar. 13, 1986.

$b >> a$

STAR COUPLER AND OPTICAL COMMUNICATION NETWORK

BACKGROUND OF THE INVENTION

The invention relates to an interconnectable star coupler and to an optical communication network configured using such star couplers.

In recent years, local area networks (LAN) are gaining in popularly as a data communication network between computers and workstations installed relatively close to one another. "Ethernet®" developed by Xerox Corporation is one such example.

FIG. 30 is a diagram showing an Ethernet-based network. In FIG. 30, reference numeral 20 designates a coaxial cable; 21, taps (branches); and 22, nodes (a terminal or station).

Each node 22 is connected to the coaxial cable 20 through the tap 21. To increase nodes 22, taps 21 must be additionally provided for connection to additional nodes.

Development in optical communications using optical fibers as transmission media is noticeable. Such excellent characteristics as wide bandwidth, low loss, high noise resistance of the optical fiber make the optical fiber suitable to LAN. However, since the optical fiber cannot provide taps as with the coaxial cable, it is difficult to configure a network similar to Ethernet.

To overcome this problem, a network in which separate terminals are provided for transmission and reception at each node and all the nodes are distributed by a star coupler has been proposed. See, e.g., G. Rawson, IEEE Transactions on Communications, Vol. COM-26, No. 7, July 1978, "Fibernet: Multimode Optical Fibers for Local Computer Networks."

FIG. 31 shows the proposed example of an optical communication network using a star coupler. In FIG. 31, reference numerals 23a, 23b designate optical fibers; 22, nodes; 24, a star coupler of a mixing rod type; and 25, terminals.

A signal from each node 22 is converted into an optical signal by each light-emitting element 22a and supplied to the star coupler 24 through each optical fiber 23a. These optical signals are mixed all together by the star coupler 24 and then distributed to the light-receiving elements 22b through the optical fibers 23b, respectively, converted to electric signals again, and supplied to the nodes 22, respectively, in the form of electric signals. Accordingly, the characteristic that a signal transmitted from a single node is transmitted to all the nodes (or multiple transmission) is provided, thus allowing a communication network similar to Ethernet to be implemented.

As shown in FIG. 32, various types of actual couplers implemented on, e.g., a glass substrate are reported. See, e.g., Wada, Okuda, and Yamasaki, 1980 National Convention of Institute of Electronics and Communication Engineers of Japan, p. 963 and E. Okuda, I. Tanaka, and T. Yamasaki, "Planar Gradiene-Index Glass Wave Guide and Its Applications to a 4-Port Branched Circuit and Star Coupler"; Applied Optics, Vol. 23, No. 11, pp. 1745-1748.

In FIG. 32, reference numeral 23 designates an optical fiber; 25, terminals; 26, a mixing section; 27, waveguides; and 28, a glass substrate. The waveguides 27 and the mixing section 28 are formed by diffusing thallium (Tl) ions, etc., into the glass substrate 28.

Similarly, there is a star coupler that is formed by a different process from the star coupler formed on the glass substrate. This example is implemented on a plastic substrate such as polycarbonate and has the same function as the aforesaid star coupler. See, e.g., Takato and Kurokawa: "Technology for Fabricating Optical Waveguides Using High Polymers", O plus E, November 1984, pp. 78-83 and T. Kurokawa, N. Takato, S. Oikawa and T. Okada, "Fiber Optic Sheet Formation by Selective Photopolymerization"; Applied Optics, Vol. 17, No. 4, pp. 646-650 (1978).

However, an optical communication network using such a star coupler has the shortcoming that network expansion is limited by the number of terminals the star coupler has.

This is because interconnection between star couplers results in forming a closed loop within the transmission path and this causes phenomena such as oscillation and attenuating vibration.

For example, as shown in FIG. 33, if one star coupler A has three pairs of input/output terminals 5-6, 7-8, 9-10 and another coupler B has three pairs of input/output terminals 11-12, 13-14, 15-16, then the input terminals 10, 11 must be connected to the output terminals 12, 9 in a cross form to interconnect both star couplers. In FIG. 33, $X_k$, $x_n$ designate input signals to the input terminals 10, 11; and $Y_k$, $y_n$, output signals from the output terminals 9, 12. The input signal $X_k$ supplied to the input terminal 10 of the star coupler A is outputted from the output terminal 9 as the output signal $Y_k$ while converted to a signal level determined by a transfer constant $A_{kk}$ from the input terminal 10 to the output terminal 9. The output signal $Y_k$ is applied to the input terminal 11 of the other star coupler B as the input signal $x_n$. Similarly, in the star coupler B the input signal $x_n$ is outputted from the output terminal 12 as the output signal $y_n$ while converted to a signal level determined by a transfer constant $B_{nn}$ from the input terminal 11 to the output terminal 12. The output signal $y_n$ is applied to the input terminal 10 of the other star coupler A as the input signal $x_n$. Thus, a closed loop shown in FIG. 34 is actually formed, circulating the signals and causing oscillation and the like.

SUMMARY OF THE INVENTION

The invention has been made to overcome the above problems. Accordingly, an object of the invention is to eliminate the difficulties accompanying the conventional ones, and to allow a network to be expanded easily by inputting/outputting an optical signal from a single terminal and thereby interconnecting star couplers through a single optical fiber.

Another object of the invention is to implement an interconnectable star coupler having an arbitrary number of terminals.

Still another object of the invention is to allow a large-scale network to be configured easily by combining star couplers having a small number of terminals while appropriately designing the distribution ratio of the star couplers.

To achieve the above objects, the transfer constant between the input and output terminals forming a pair, the pair of the star coupler being connected to a single node, must be made zero. This allows a plurality of star couplers to be interconnected from one to another for network expansion. For convenience, a star coupler, in which the transfer constant between an input terminal and an output terminal forming a pair to be connected to a single node is set to zero, is hereinafter referred to as an "interconnectable star coupler." Bidirectional communications are possible between two nodes interconnected in a network thus implemented, and this bidirectionality permits collision detection to be implemented easily.

However, in an optical communication network using the aforesaid star coupler, two optical fibers for transmission and reception must be provided, requiring a larger number of optical fibers, connectors, and link amplifiers in configuring a network, compared to a single coaxial cable serving both as a transmission and a reception cable in Ethernet. Particularly, when the network path is long, preparation of two optical fibers, which are expensive, not only elevates installation cost, but also imposes handling problems.

Further, when expanding the optical communication network configured by interconnecting the star couplers, not only it is difficult to fabricate the star couplers, but also such configuration demands a large initial investment.

In configuring an optical network having, e.g., 32 nodes, a 32-terminal star coupler must be prepared. It is not only difficult but also expensive to manufacture a star coupler having an extremely large number of terminals as a single unit. Even in the case where an initially small network is to be expanded into a finally large-scale network, a 32-terminal star coupler must be prepared from the very first stage, thus entailing a large initial investment.

To achieve the above objects, a star coupler of the invention has a plurality of terminals and allows an optical signal to be inputted to and outputted from a single terminal. The star coupler also has such a transfer characteristic that an input signal to an initially inputted terminal is not distributed as an output signal from the initially inputted terminal but distributed as output signals to its terminals other than the initially inputted terminal.

This star coupler includes: three terminals, each inputting and outputting an optical signal to and from a single terminal; three directional optical couplers; optical waveguides formed between the terminals and the directional optical couplers, respectively; and optical waveguides formed between the directional optical couplers, respectively.

To achieve the above objects, an optical network of the invention includes a plurality of star couplers, each of which has a plurality of terminals and allows an optical signal to be inputted to and outputted from a single terminal, and interconnects the star couplers through such terminal. However, the star coupler has such a transfer characteristic that an input signal to an initially inputted terminal is not distributed as an output signal from the initially inputted terminal but distributed as output signals to its terminals other than the initially inputted terminal.

The invention is applied to a star coupler having three or more terminals and distributing no optical signal to an initially inputted terminal. In such a star coupler, a transfer characteristic is selected so that an optical signal inputted from a specific single terminal is distributed substantially equally to all terminals other than the specific single terminal and that a distribution ratio of an optical signal inputted from a terminal other than the specific single terminal to the specific single terminal is larger than the distribution ratio of the optical signal to each of the other terminals.

Further, the invention is applied to an optical communication network that is implemented by connecting the specific single terminal of the aforesaid star coupler to a terminal of a passive star coupler having three or more terminals with no distribution of an optical signal to an initially inputted terminal and with substantially equal distribution of the optical signal to terminals other than the initially inputted terminal.

The other object of the invention is to ensure a communication path for an optical signal and thereby provide a fail-safe function in the event of abnormality by reducing the attenuation of the optical signal passing through optical an link amplifier even if some trouble happens at an optical amplifier.

While it is conceivable to increase an input gain on the part of the terminal unit, an excessive increase in gain degrades the signal-to-noise ratio and the waveform attributable to the normal signal being saturated. Thus, there is a limit in increasing the gain.

To achieve the above object, the invention is applied to an optical link amplifier that not only distributes an input signal beam into a plurality of beams by an optical distributing unit and amplifies one of the distributed input signal beams by an optical amplifier, but also passes the other distributed input signal beam through a bypass optical waveguide and synthesizes an output beam from the optical amplifier with the beams having passed through the bypass optical waveguide by an optical synthesizing unit.

BRIEF DESCRIPTION OF THE DRAWINGS

In the accompanying drawings.

DESCRIPTION OF THE PREFERRED EMBODIMENTS

An operation of the invention will be described with reference to some specific examples.

Figure 1:
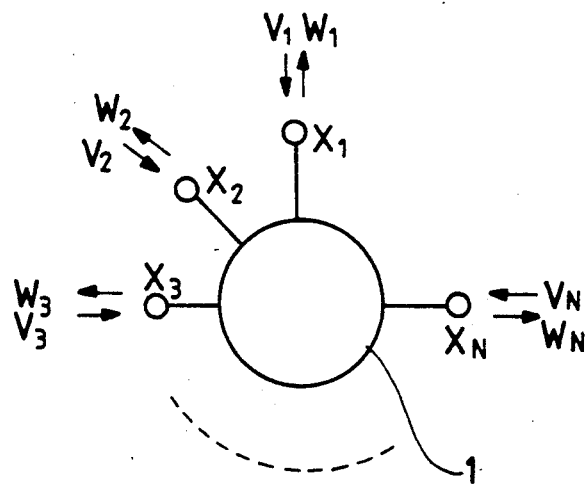
FIG. 1 is a conceptual diagram of a star coupler of the invention.

A star coupler of the invention is so configured as to connect a single node to a single terminal. A schematic representation of its configuration is as shown in FIG. 1.

A star coupler 1 has a plurality (N) of terminals $x_1, x_2, \ldots x_N$. Assuming that input signal to the respective terminals $x_1, x_2, \ldots, x_N$ are $v_1, v_2, \ldots, v_N$ and output signals thereof are $w_1, w_2, \ldots, w_N$, the transfer characteristic of this star coupler can be given as follows by a matrix expression.

$$\begin{bmatrix} w_1 \\ w_2 \\ \cdot \\ \cdot \\ \cdot \\ w_N \end{bmatrix} = \begin{bmatrix} m_{11} & m_{12} & \cdots & m_{1M} \\ m_{21} & m_{22} & \cdots & m_{2M} \\ \cdot & \cdot & & \cdot \\ \cdot & \cdot & & \cdot \\ \cdot & \cdot & & \cdot \\ m_{N1} & m_{N2} & \cdots & m_{NM} \end{bmatrix} \begin{bmatrix} v_1 \\ v_2 \\ \cdot \\ \cdot \\ \cdot \\ v_N \end{bmatrix} \quad (1)$$

In the invention, since an input from an initially inputted terminal is not distributed as an output but distributed as outputs to terminals other than the initially inputted terminal, diagonal components in the above equation are all zero, and all components other than the diagonal components are not zero. Hence, each component of the matrix in equation (1) can be expressed as follows.

$$m_{ij} = C_{ij}(1 - \delta_{ij}) \quad (2)$$

where N is an integer satisfying that $N \geq 3$; i is a natural number satisfying that $i \leq N$; j is a natural number satisfying that $j \leq N$; $\delta_{ij}$ is a delta function; and $C_{ij}$ is a number satisfying that $|C_{ij}| < 0$.

The term "delta function" herein used refers to a function that becomes 1 when i is equal to j and 0 when i is not equal to j, as shown by the following equation (3).

$$\delta_{ij} = \begin{cases} 0 & (i \neq j) \\ 1 & (i = j) \end{cases} \quad (3)$$

In an actual star coupler, it is not possible to make the diagonal components in equation (1) completely zero; it is inevitable to have a return of some light beam. This is for the same reason as noise cannot completely be eliminated from electronic circuits. In the invention, that an input signal to an initially inputted terminal is not distributed as an output signal from such initially inputted terminal is a conceptual definition. Even if return of a signal from an initially inputted terminal to the initially inputted terminal does take place, it goes without saying that star couplers with a scanty return light can be considered within the scope of the invention unless such signal or such return is positively used for some specific purpose.

According to the thus configured star coupler, the transmission line and the receiving line can be implemented by a single optical fiber, and as a result, a node and a star coupler can be connected to each other through the single optical fiber. Further, when two or more star couplers are interconnected for the expansion of a network, a signal sent from one star coupler to another does not circulate. As a result, the network can be expanded by interconnecting a single terminal of each star coupler. Still further, not only bidirectional communications are possible between two nodes connected to the network, but also the bidirectionality can readily be utilized for collision detection.

Figure 35:
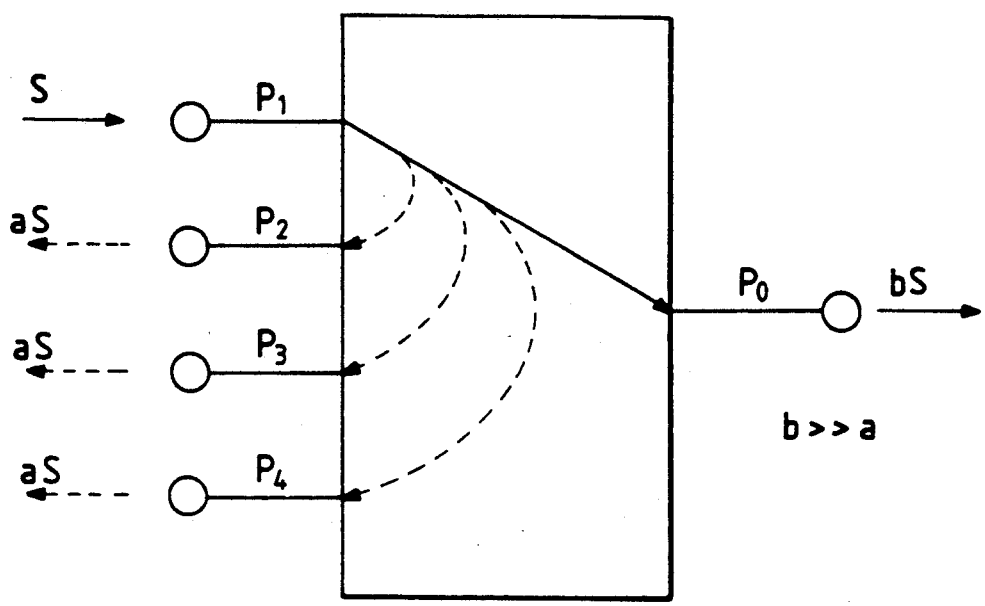
FIG. 35 is a conceptual diagram showing how a signal inputted to terminals other than a specific single terminal is distributed in a star coupler of the invention.
Figure 36:
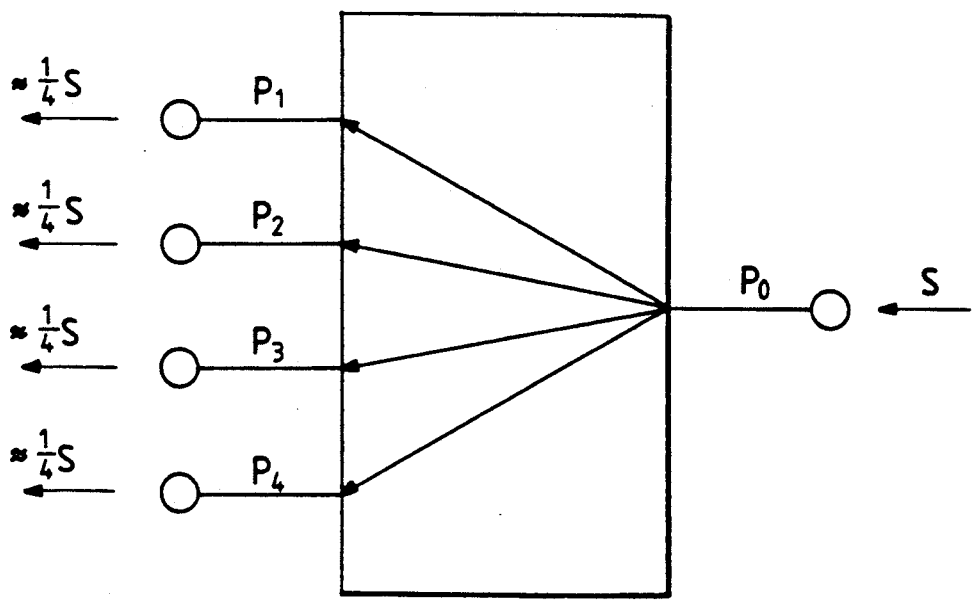
FIG. 36 is a conceptual diagram showing how a signal inputted from a specific single terminal is distributed in a star coupler of the invention.

FIGS. 35 and 36 schematically show how a signal of a star coupler of the invention is distributed. This example consists of a specific single terminal $P_0$ and other four terminals $P_1, P_2, P_3, P_4$.

As shown in FIG. 35, when a signal S is inputted to the terminal $P_1$, a signal bS is distributed to the specific single terminal $P_0$, while a signal aS is distributed to each of the other three terminals $P_2, P_3, P_4$. No signal is distributed to the initially inputted terminal $P_1$. However, such a relationship as $bS > > aS > 0$ is satisfied. The same applies when each of the terminals $P_2, P_3, P_4$ initially receives an input.

As shown in FIG. 36, when a signal is inputted to the specific single terminal $P_0$, the signal S is equally distributed to the four terminals $P_1, P_2, P_3, P_4$. The initially inputted terminal $P_0$ has no signal distributed. This relationship can be expressed as follows using a matrix.

$$\begin{bmatrix} y_0 \\ y_1 \\ y_2 \\ y_3 \\ y_4 \end{bmatrix} = \begin{bmatrix} 0 & b & b & b & b \\ 1/4 & 0 & a & a & a \\ 1/4 & a & 0 & a & a \\ 1/4 & a & a & 0 & a \\ 1/4 & a & a & a & 0 \end{bmatrix} \begin{bmatrix} x_0 \\ x_1 \\ x_2 \\ x_3 \\ x_4 \end{bmatrix} \quad (4)$$

where $x_0, x_1, x_2, x_3, x_4$ are the input signals to $P_0, P_1, P_2, P_3, P_4$, and $y_0, y_1, y_2, y_3, y_4$ are the output signals.

The star coupler of the invention must have only one terminal that corresponds to $P_0$, but the number of other terminals is arbitrarily selective. The signal distribution of the star coupler of the invention consisting of a specific single terminal and N terminals (hence, the total number of terminals is $N+1$) can be expressed as follows using a matrix.

$$\begin{bmatrix} y_0 \\ y_1 \\ y_2 \\ \cdot \\ \cdot \\ \cdot \\ y_n \end{bmatrix} = \begin{bmatrix} 0 & b & b & \cdots & b \\ c & 0 & a & \cdots & a \\ c & a & 0 & \cdots & a \\ \cdot & \cdot & \cdot & & \cdot \\ \cdot & \cdot & \cdot & & \cdot \\ \cdot & \cdot & \cdot & & \cdot \\ c & a & a & \cdots & 0 \end{bmatrix} \begin{bmatrix} x_0 \\ x_1 \\ x_2 \\ \cdot \\ \cdot \\ \cdot \\ x_n \end{bmatrix} \quad (5)$$

where $x_0, x_1, x_2, \ldots x_n$ are the input signals to $P_0, P_1, P_2, \ldots P_n$, and $y_0, y_1, y_2, \ldots y_n$ are the output signals. Reference character "c" in equation (5) takes the value of $1/n$, assuming that the star coupler is in an ideal condition with no losses or fabrication errors. Such a relationship as $b + (n-1)a = 1$ is satisfied.

Figure 37:
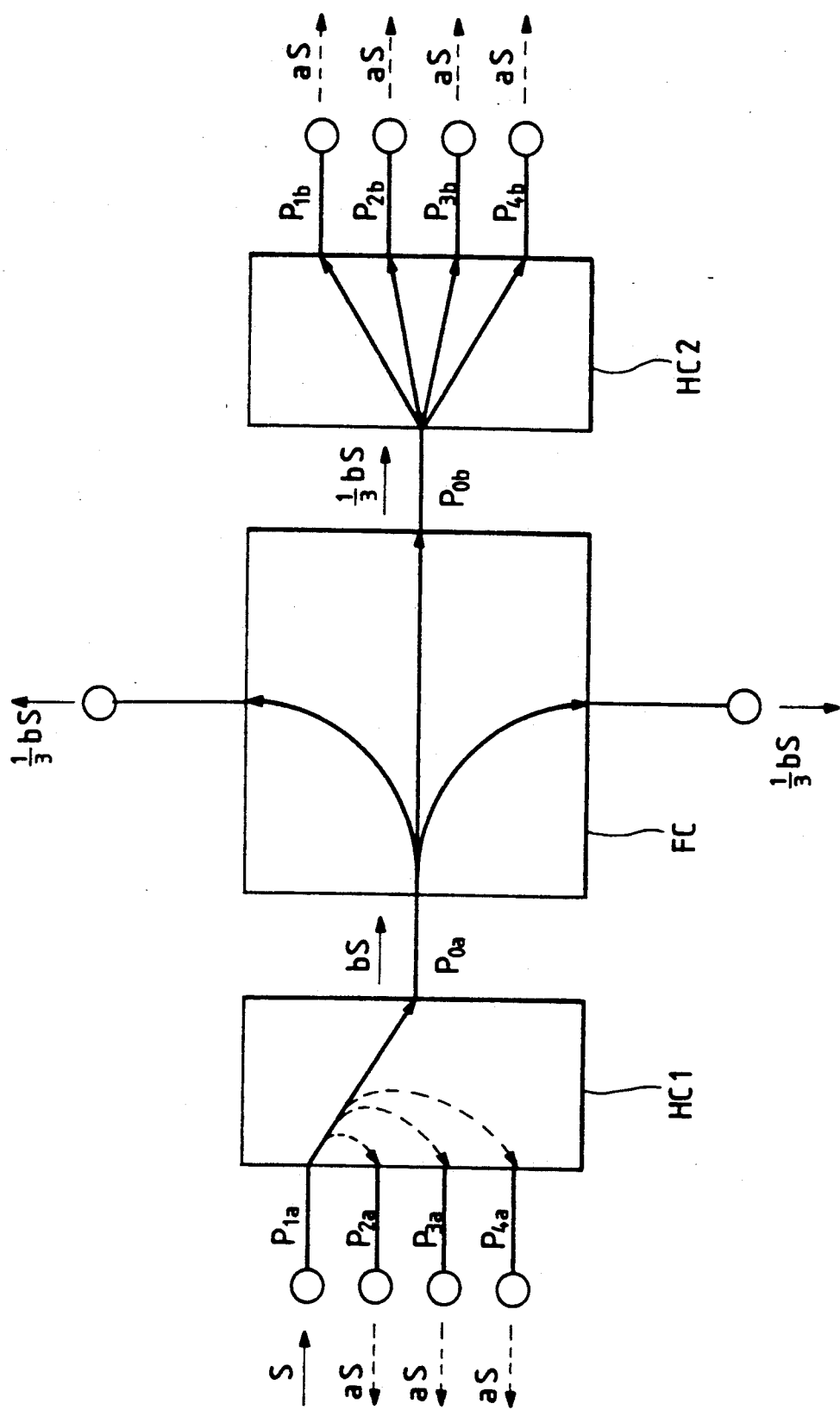
FIG. 37 is a conceptual diagram showing how a signal is distributed in a star coupler that is implemented by connecting 5-terminal star couplers (4-terminal half couplers) and 4-terminal star couplers whose transfer matrix to other terminals are substantially equal of the invention.

FIG. 37 schematically shows an optical communication network configured by connecting the specific single terminal of a star coupler whose diagonal components of the aforesaid transfer matrix are all zero but whose all other components are not equal (hereinafter referred to as "half coupler") to the specific single terminal of a star coupler whose diagonal components of the transfer matrix are all zero and whose all other components are substantially equal (hereinafter referred to as "full coupler"), the latter star coupler being such as disclosed in the specification of Japanese Patent Application No. 409070/1990. Here, the number of terminals of a front end coupler (the half coupler in the example of FIG. 37) is hereinafter expressed by the number of terminals save the specific single terminal, and the number of terminals of a center coupler (the full coupler in the example of FIG. 37) can be expressed by the total number.

FIG. 37 shows a network consisting of two 4-terminal half couplers (HC1, HC2) and a 4-terminal center coupler (full coupler) (FC) An input signal S to a terminal $P_{1a}$ of the half coupler HC1 has the majority of signal power bS distributed to the specific single terminal $P_{0a}$, but also has the signal distributed to terminals $P_{2a}$, $P_{3a}$, $P_{4a}$. Since the terminal $P_{0a}$ is connected to a single terminal of the full coupler FC, each of the other three terminals of the full coupler receives a signal (¼) bS.

From a specific single terminal $P_{0b}$ of another half coupler HC2 that is connected to the full coupler FC to each of its other terminals $P_{1b}$, $P_{2b}$, $P_{3b}$, $P_{4b}$, a signal aS, which is ¼ ×(¼) bS=bS/12 is distributed. If a b/12, the distribution ratio to $P_{2a}$, $P_{3a}$, $P_{4a}$ and the distribution ratio of $P_{1b}$, $P_{2b}$, $P_{3b}$, $P_{4b}$ can be equal. Such a relationship can be generalized as follows.

If the nondiagonal components of the transfer matrix of the full coupler are all equal, the value of a nondiagonal component is assumed to be d. Then, the transfer matrix of the m-terminal full coupler can be expressed as follows.

$$\begin{bmatrix} y_1 \\ y_2 \\ y_3 \\ \cdot \\ \cdot \\ y_m \end{bmatrix} = \begin{bmatrix} 0 & d & d & \ldots & d \\ d & 0 & d & \ldots & d \\ d & d & 0 & \ldots & d \\ & \cdots & & & \\ & \cdots & & & \\ d & d & d & \ldots & 0 \end{bmatrix} \begin{bmatrix} x_1 \\ x_2 \\ x_3 \\ \cdot \\ \cdot \\ x_m \end{bmatrix}$$

The value d becomes $1/(m-1)$ in an ideal condition with no losses or variations. From the above considerations, when the n-terminal half couplers and an m-terminal full coupler are combined as shown in FIG. 37, the distribution ratio to each terminal of the half couplers becomes equal as long as values a, b satisfy the following relationships.

$$a = bcd = b/n(m-1) \quad (6)$$

$$a = 1/(nm-1) \quad (7)$$

$$b = (nm-n)/(nm-1) \quad (8)$$

Embodiments of the invention will be described in detail with reference to the drawings.

Figure 2:
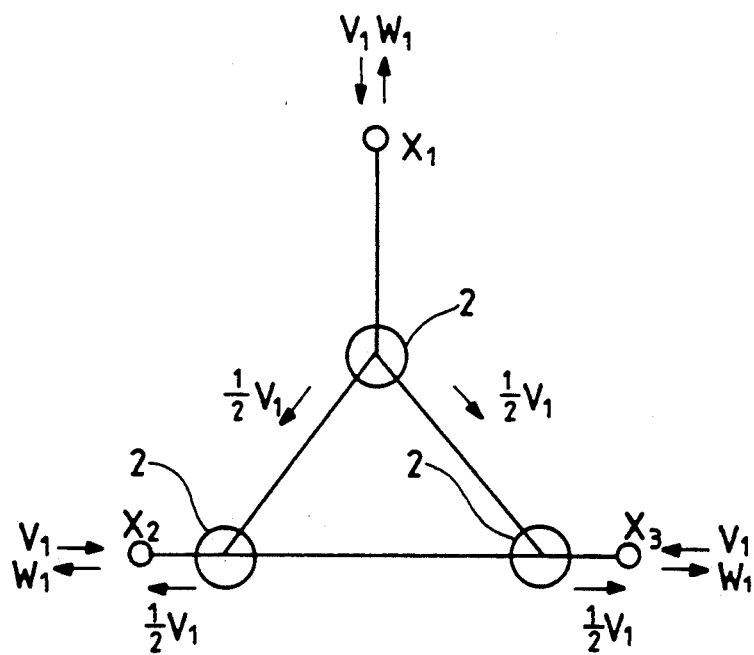
FIG. 2 is a schematic diagram of a 3-terminal interconnectable star coupler, which is an embodiment of the invention.
Figure 3:
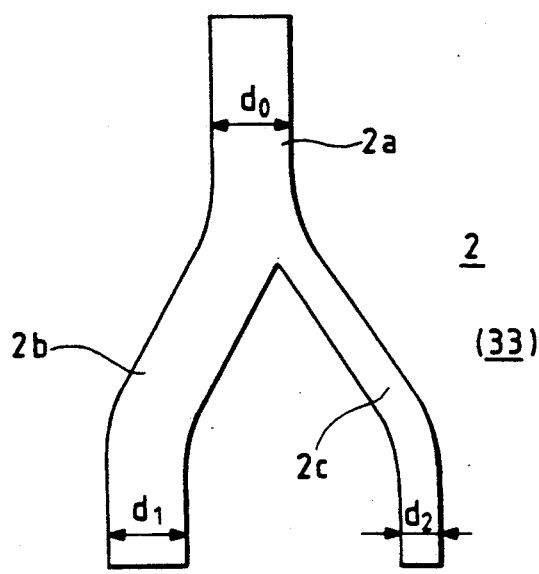
FIG. 3 is a plan view of an optical distributing/synthesizing unit used in the FIG. 2 star coupler.

FIG. 2 shows an embodiment of a 3-terminal interconnectable star coupler. Three optical distributing/synthesizing units 2 are interconnected so as to form a triangle, and terminals $x_1$, $x_2$, $x_3$ are drawn from the respective optical distributing/synthesizing units 2. Each optical distributing/synthesizing unit 2 has such a structure as shown in FIG. 3, with a $d_0$-wide single waveguide 2a distributed into two waveguides 2b, 2c. If the widths $d_1$, $d_2$ of the distributed waveguides 2b, 2c are equal to each other, their distribution ratio becomes 1:1. If $d_1 > d_2$, it is $d_1$ that receives more beam. Their distribution ratio becomes substantially equal to the ratio between their widths.

In the embodiment shown in FIG. 2, the distribution ratio of the respective optical distributing/synthesizing units 2 is set to 1:1, and an input signal to a single terminal is outputted to other two terminals while distributed by half. There practically is no return light to the initially inputted terminal. Therefore, the input signals $v_1$, $v_2$, $v_3$ and output signals $w_1$, $w_2$, $w_3$ at the three terminals $x_1$, $x_2$, $x_3$ satisfy the following relationship.

$$\begin{bmatrix} w_1 \\ w_2 \\ w_3 \end{bmatrix} = \begin{bmatrix} 0 & 1/2 & 1/2 \\ 1/2 & 0 & 1/2 \\ 1/2 & 1/2 & 0 \end{bmatrix} \begin{bmatrix} v_1 \\ v_2 \\ v_3 \end{bmatrix} \quad (9)$$

The aforesaid optical distributing/synthesizing unit 2 can be fabricated on the basis of the art disclosed, e.g., in a publication (Yamasaki and Okuda: "Fabrication Technology in Glass Material," O plus E, November 1984, pp. 71-78.

Figure 4:
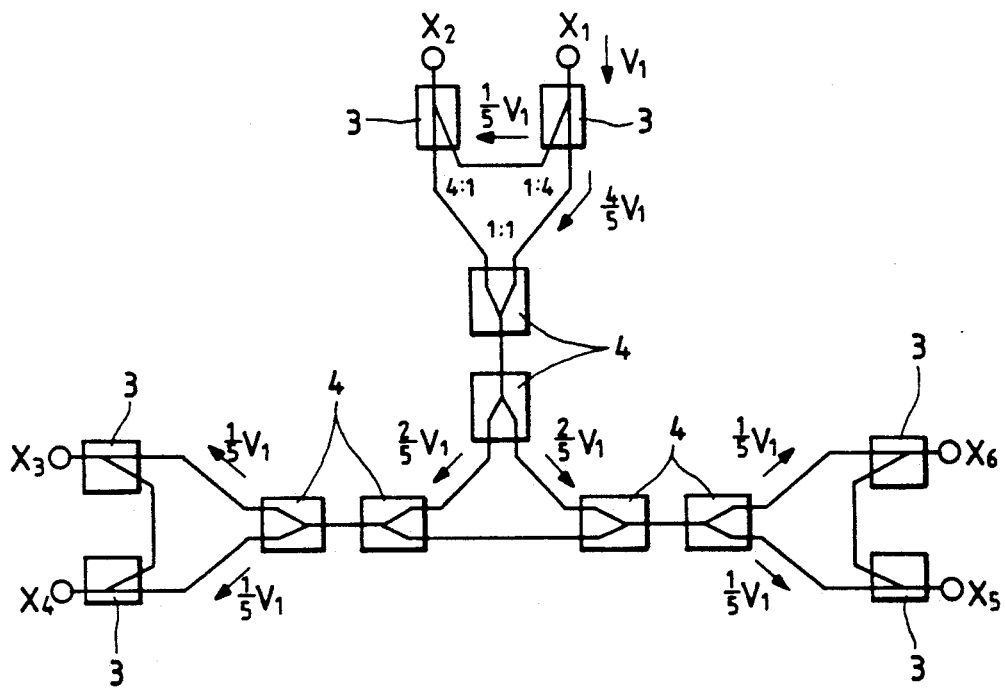
FIG. 4 is a schematic diagram showing a 6-terminal interconnectable start coupler, which is an embodiment of the invention.

While the embodiment with three terminals (N=3) has been described above, an embodiment with more terminals, specifically, six terminals, is shown in FIG. 4.

In the embodiment shown in FIG. 4, the combination of optical distributing/synthesizing units 3, each having a distribution ratio of 4:1, and optical distributing/synthesizing units 4, each having a distribution ratio of 1:1, allows a signal $v_1$ inputted from a terminal $x_1$ to be distributed only by (1/5) $v_1$ to a terminal $x_2$, with the rest (4/5) $v_1$ to be further distributed as shown in FIG. 4. As a result, a signal of (1/5) $v_1$ is distributed to each of terminals $x_2$, $x_3$, $x_4$, $x_5$, $x_6$.

The same applies to each of the terminals $x_2$, $x_3$, $x_4$, $x_5$, $x_6$ when they receive an input signal. Their distribution can be represented by a determinant (10).

$$\begin{bmatrix} w_1 \\ w_2 \\ w_3 \\ w_4 \\ w_5 \\ w_6 \end{bmatrix} = \begin{bmatrix} 0 & 1/5 & 1/5 & 1/5 & 1/5 & 1/5 \\ 1/5 & 0 & 1/5 & 1/5 & 1/5 & 1/5 \\ 1/5 & 1/5 & 0 & 1/5 & 1/5 & 1/5 \\ 1/5 & 1/5 & 1/5 & 0 & 1/5 & 1/5 \\ 1/5 & 1/5 & 1/5 & 1/5 & 0 & 1/5 \\ 1/5 & 1/5 & 1/5 & 1/5 & 1/5 & 0 \end{bmatrix} \begin{bmatrix} v_1 \\ v_2 \\ v_3 \\ v_4 \\ v_5 \\ v_6 \end{bmatrix} \quad (10)$$

Figure 5:
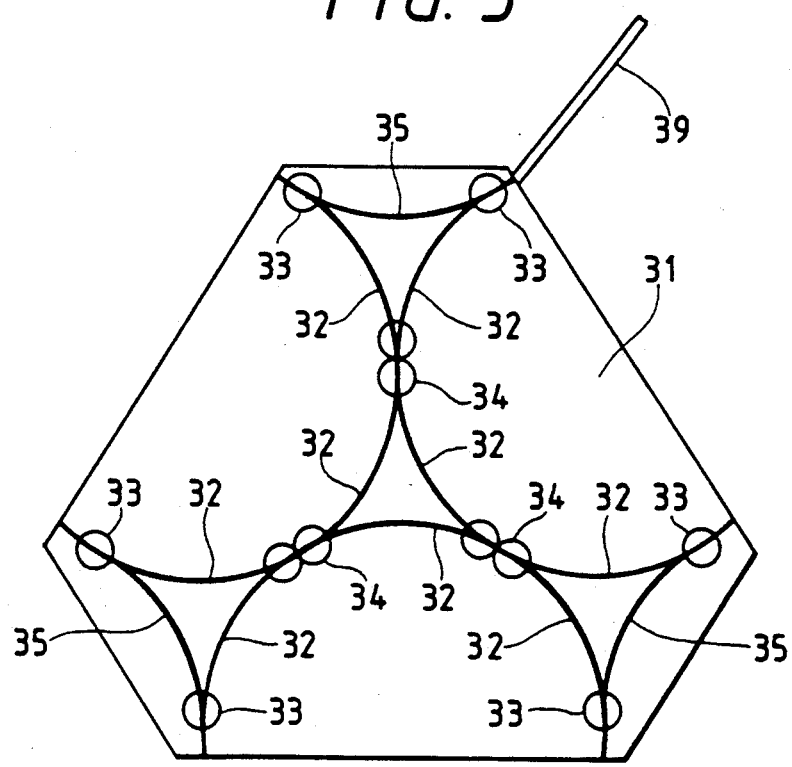
FIG. 5 is a plan view of the star coupler of FIG. 4 when implemented on a substrate as an optical integrated circuit.

FIG. 5 is a plan view showing an example in which the 6-terminal interconnectable star coupler as shown in FIG. 4 is implemented on a polycarbonate substrate.

The substrate is made of polycarbonate containing methyl acrylate monomer. When the substrate is exposed to ultraviolet rays interposing a mask therebetween, the monomer onto which the ultraviolet rays have been injected reacts to form a portion exhibiting a low refractive index, while the portion onto which no ultraviolet rays have been injected form an optical waveguide layer. This is a well known fabrication method. See, e.g., Takato and Kurokawa: "Technology for Fabricating Optical Waveguides Using High Polymers," O plus E, November 1984, pp. 78-83.

Figure 6:
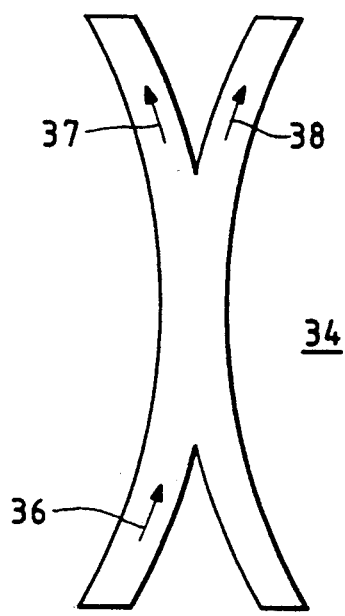
FIG. 6 is a plan view of an optical distributing branch used in the star coupler of FIG. 5.

In FIG. 5, on a polycarbonate substrate 31 that is generally hexagonal in shape are three semicircular optical waveguides 32 formed so that they are in contact with one another circumferentially. Further, three arcuate optical waveguides 35 are formed so that each of them is in contact with the two semicircular optical waveguides 32 circumferentially. Optical distributing/synthesizing units 33, each having a distribution ratio of 4:1, are provided at points of contact between the waveguides 32 and the waveguides 35. Each optical distributing/synthesizing unit 33 is formed in such a manner that the width $d_0$ of the waveguide 2a, which is a pre-distributed terminal of the optical distributing/synthesizing unit 2 shown in FIG. 3, is distributed to widths $d_1$, $d_2$ at an appropriate ratio. At points of contact between the respective waveguides 32 are optical distributing paths 34, which serve to synthesize and distribute an optical signal. As shown in FIG. 6, each optical distributing path 34 has a part of the two waveguides in common. For example, an optical component 36 is distributed to two optical components 37, 38. Further, an end of an optical fiber 39 (only one fiber is shown in FIG. 5) is connected to an end of each waveguide 32. The other end of this optical fiber 39 is connected to a node (not shown). A detailed structure of the node will be described later.

In FIG. 5, the respective optical waveguides 32, 35 are formed so that six circles, each having the same radius, are circumscribed. This is because there is a minimum bendable radius for a waveguide and when a waveguide is bent at a radius smaller than the minimum bendable radius, its radiation loss is increased noticeably. The width of the optical waveguide 35 is made smaller than that of the optical waveguide 32 in correspondence to the relationship between the widths $d_1$, $d_2$ of the optical distributing/synthesizing unit shown in FIG. 3.

Figure 7:
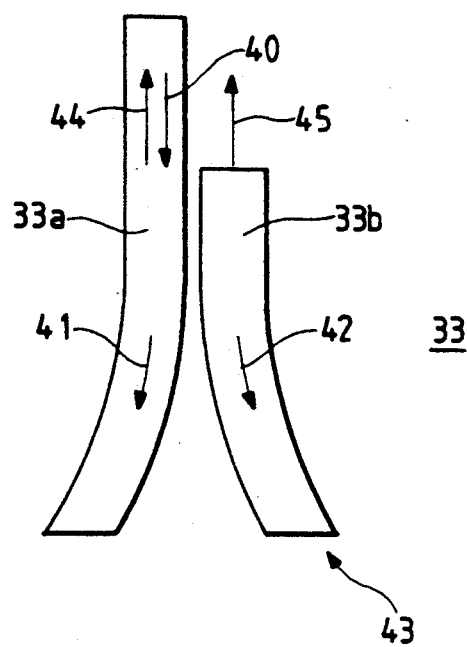
FIG. 7 is a plan view of a directional coupler based on coupled mode theory, formed of an optical waveguide used in the star coupler of FIG. 5.

While the polycarbonate substrate 31 is used in the example shown in FIG. 5, a glass substrate with optical waveguides being formed by diffusing thallium (Tl) ions, etc., may be implemented. In this case, the portions corresponding to the optical distributing/synthesizing units 33 shown in FIG. 5 must be implemented by directional optical couplers based on coupled mode theory as shown in FIG. 7. This is because it is difficult to form waveguides whose radii are different on a single substrate from fabrication restrictions. The distribution ratio of each portions corresponding to each optical distributing/synthesizing unit 33 of the star coupler shown in FIG. 5 is set to 2:1 to make all nondiagonal components in the transfer characteristic equal. In the directional optical coupler shown in FIG. 7, an optical component 40 inputted from one optical waveguide 33a is distributed to two optical components 41, 42. A part of an optical component 43 inputted from another optical waveguide 33b is transmitted to become an optical component 44, with the rest becoming an optical component of loss 45.

The transfer matrix in this case can be expressed by equation (11).

$$\begin{bmatrix} w_1 \\ w_2 \\ w_3 \\ w_4 \\ w_5 \\ w_6 \end{bmatrix} = \begin{bmatrix} 0 & 1/9 & 1/9 & 1/9 & 1/9 & 1/9 \\ 1/9 & 0 & 1/9 & 1/9 & 1/9 & 1/9 \\ 1/9 & 1/9 & 0 & 1/9 & 1/9 & 1/9 \\ 1/9 & 1/9 & 1/9 & 0 & 1/9 & 1/9 \\ 1/9 & 1/9 & 1/9 & 1/9 & 0 & 1/9 \\ 1/9 & 1/9 & 1/9 & 1/9 & 1/9 & 0 \end{bmatrix} \begin{bmatrix} v_1 \\ v_2 \\ v_3 \\ v_4 \\ v_5 \\ v_6 \end{bmatrix} \quad (11)$$

The reason why the loss generated at the time of distribution is greater in equation (11) than in equation (10) is that such an optical loss component 45 as shown in FIG. 7 is present. When the distribution ratio of the portion corresponding to the optical distributing/synthesizing unit 33 is not 2:1, it is not possible to make all nondiagonal components equal, i.e., 1/9.

It seems from the above observation that the implementation of the star coupler shown in FIG. 5 on the glass substrate is not advantageous. However, in the optical waveguide formed on the aforesaid polycarbonate substrate, a −35 dB or so return light is generated at the interface of polycarbonate substrate/optical fiber, while when the waveguide is formed on the glass substrate, the advantage that the return light can be reduced significantly to −50 dB is obtained. The optical distributing/synthesizing unit such as shown in FIG. 3 has the shortcoming that it is applicable to a multimode optical waveguide but that it is difficult to apply it to a single-mode optical waveguide. In contradistinction thereto, the implementation shown in FIG. 7 has the advantage that it can be applied to a single-mode optical waveguide.

Figure 8:
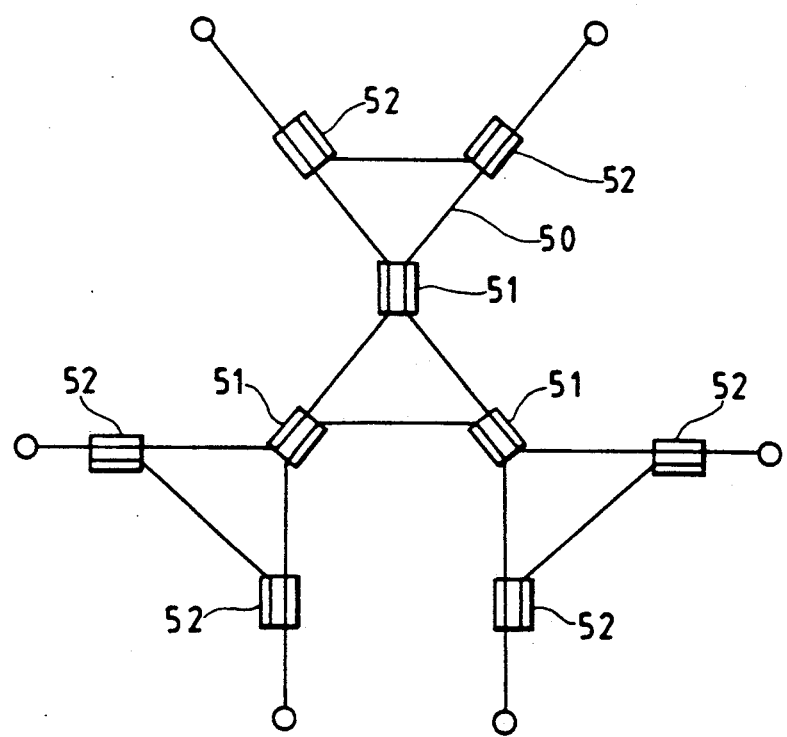
FIG. 8 is a schematic diagram showing a 6-terminal star coupler of the invention, which is implemented by fused couplers.

A star coupler similar to the one shown in FIG. 5 may be implemented using fused couplers. In FIG. 8, reference numeral 51 designates fused couplers, each having a distribution ratio of 1:1; and 52, fused couplers, each having a distribution ratio of 2:1. The term "fused coupler" herein used means a coupler formed by fusing two optical fiber clads together and making the cores of the optical fibers sufficiently close to each other. The fused coupler functions as a directional optical coupler.

Figure 9:
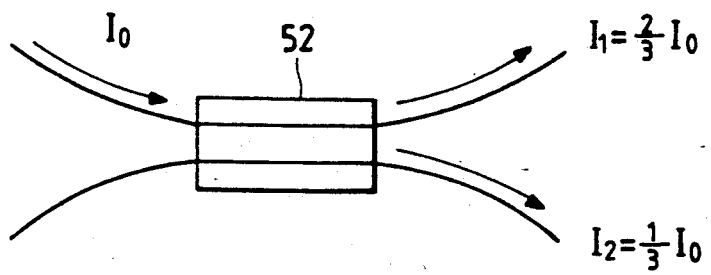
FIG. 9 is a diagram illustrative of a distribution ratio of the fused coupler.

The distribution ratio of each fused coupler 52 functioning as a directional coupler will be defined as shown in FIG. 9. If a beam injected from an end of a single optical path is $I_0$ and a light beam injected from the other end of that single path is $I_1$ out of two optical fibers or optical waveguides, then the distribution ratio is expressed as being $I_1:I_2$. Accordingly, with the distribution ratio being 2:1, $I_1=(2/3)I_0$ and $I_2=(1/3)I_0$.

Figure 10:
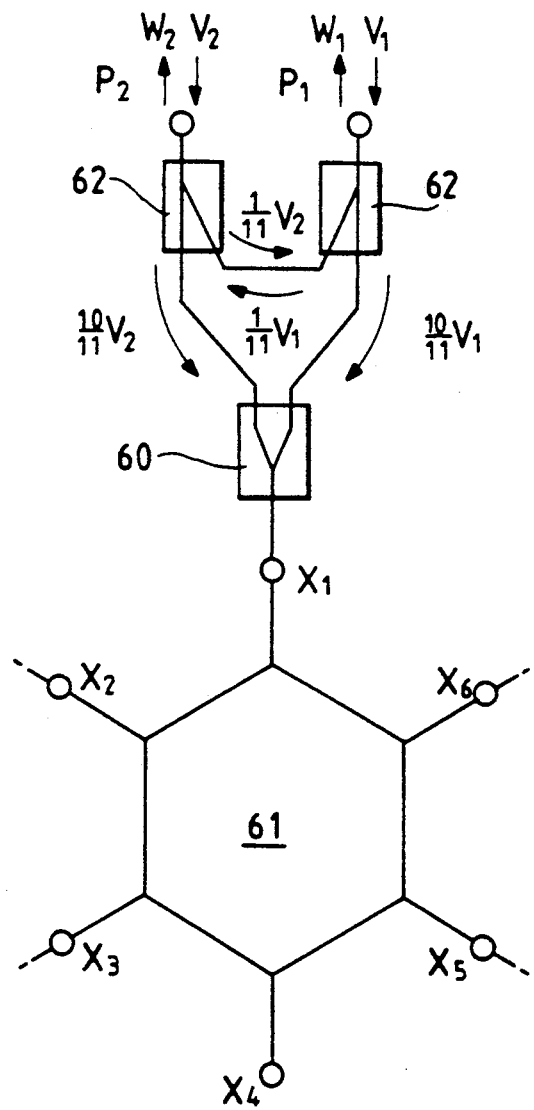
FIG. 10 is a diagram showing a method of expanding a 6-terminal star coupler into a 12-terminal star coupler.

A star coupler having still more terminals and the same function can also be implemented. As shown in FIG. 10, it is an embodiment in which optical distributing branch 62, each having a distribution ratio of 10:1, and an optical distributing branch 60 with a distribution ratio 1:1 are connected to the respective terminals $x_1$, $x_2$, $x_3$, $x_4$, $x_5$, $x_6$ of the 6-terminal star coupler 61 shown in FIG. 4 in the triangle form. According to this embodiment, a 12-terminal star coupler having a transfer characteristic matrix in which each of all diagonal components is 1/11 can be implemented. It goes without saying that a star coupler with still more terminals such as 24 terminals, 48 terminals, and so on, can be implemented on the basis of the same technique.

Figure 11:
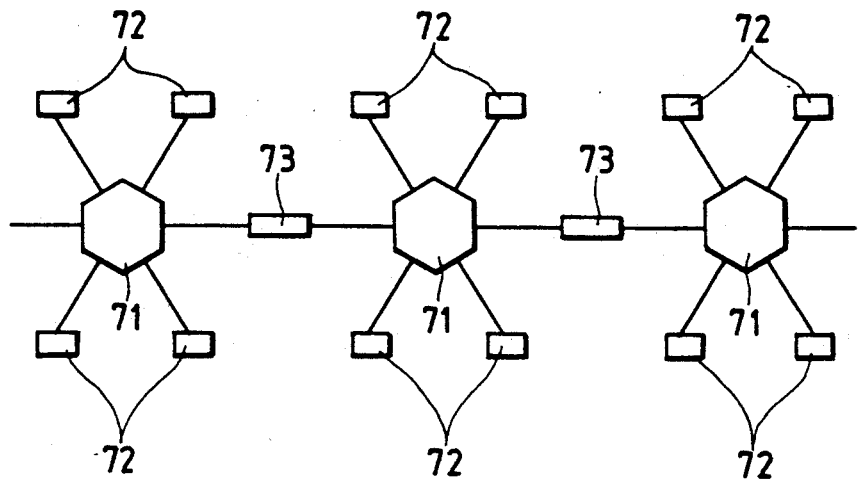
FIG. 11 is a diagram showing an optical communication network configured by connecting a plurality of star couplers of the invention.

FIG. 11 is a diagram showing an embodiment of an optical communication network configured using the aforesaid 6-terminal star coupler. Nodes 72 are connected to 4 terminals out of the 6 terminals of each of star couplers 71. The remaining two terminals are used to interconnect between the star couplers 71. In this case, the star couplers 71 are interconnected through link amplifiers 73. Each link amplifier 73 is preferably made up of a bidirectional optical amplifier, such as rare earth element doped-fiber amplifier or a semiconductor laser amplifier; it may, of course, be an ordinary reproducing link amplifier. For rare earth element-doped fiber amplifiers, see "Optical Fiber Amplifiers" by Horiguchi, Kogaku, Vol. 19, No. 5 (May 1990), pp. 275-282 and S. Shimada, "Impact of Erbium-Doped Fiber Amplifiers on Optical Communication Systems," Optics & Photonics News, January 1990, pp. 6-12 (1990), and for semiconductor laser amplifiers, see "Studies on Semiconductor Laser Amplifiers Used in Optical Communication Systems," O plus E, August 1989, pp. 106-111 and M. J. O'Mahony: "Optical Amplifiers and Their Applications," Phil. Trans. R. Soc. Lond. A329, pp. 143-152 (1989).

In the configuration shown in FIG. 11, when a rare earth element-doped fiber amplifier is used as the link amplifier 73, a signal beam is transmitted, although slightly, even if a pumping light source is failed. Thus, it is possible to design the network so that the failure of a single amplifier does not set off a failure of the entire network, thereby ensuring high reliability.

Figure 12:
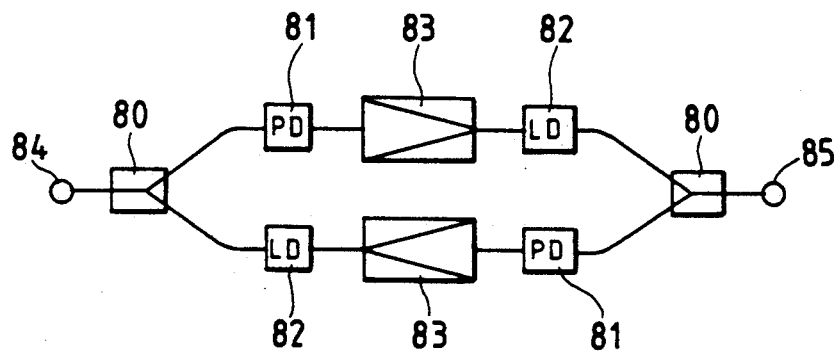
FIG. 12 is a diagram showing an internal structure of a bidirectional reproducing link amplifier used in the optical communication network of FIG. 11.

When a reproducing link amplifier is used, amplifiers must be prepared on a parallel basis as shown in FIG. 12. That is, two optical distributing/synthesizing units 80, two light-receiving units 81, two light-injecting sources 82, and two amplifiers 83 must be provided for bidirectional amplification. This reproducing link amplifier serves not only to amplify a signal bidirectionally, but also to assume the function of a so-called "2R" (Reshaping, Retiming) and "3R" (Reshaping, Retiming, Regenerating). Each of the terminals 84, 85 shown in FIG. 12 is connected to a single terminal of each separate star coupler.

Figure 13:
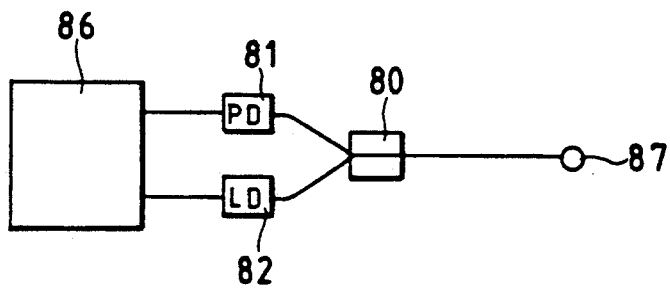
FIG. 13 is a diagram showing the internal structure of a node.

Each node 71 of the optical communication network shown in FIG. 11 includes a light-receiving unit 81 such as a photodiode and a light-injecting source 82 such as a laser diode as shown in FIG. 13 to thereby distribute and synthesize a beam by an optical distributing/synthesizing unit 80. A terminal 87 drawn out from the optical distributing/synthesizing unit 80 is connected to a single terminal of each interconnectable star coupler 71 shown in FIG. 11. Reference numeral 86 designates a terminal unit such as a workstation.

The distribution ratio of each star coupler shown in the embodiments of the invention is set so that the nondiagonal components of their transfer matrix can be equal to one another. This is to allow a new star coupler to be interconnected through a link amplifier from any terminal of the interconnectable star coupler for network expansion. That is, by making the nondiagonal components of the transfer matrix equal, gains required of the respective link amplifiers become substantially equal to one another, thereby allowing a communication network to be configured by combining link amplifiers whose gain is the same as that of a standardized star coupler having the same number of terminals.

The star coupler may be implemented not only on a polycarbonate substrate and a glass substrate, but also on a dielectric such as sapphire or single crystal lithium niobate, or a semiconductor such as GaAs, InP, or Si. Accordingly, a star coupler having the aforesaid characteristic can be implemented as an optical integrated circuit. This is an integrated circuit because each of the circuit implementations shown in FIGS. 2, 4, 5, and 10 is planar with no optical waveguides intersecting.

While the 3-, 6-, and 12-terminal interconnectable star couplers are taken as examples in the above embodiments, the invention may be applied to star couplers having an arbitrary number of terminals.

Embodiments in which interconnectable star couplers having an arbitrary number of terminals will now be described.

Figure 14:
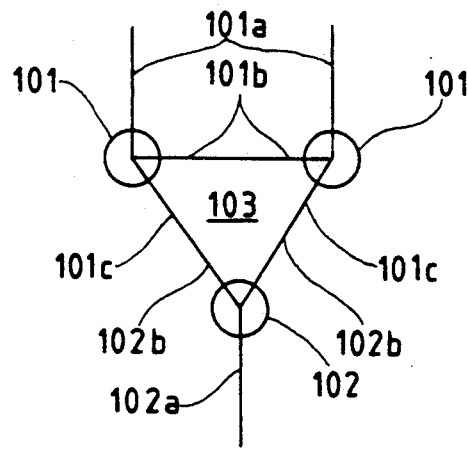
FIG. 14 is a diagram showing a schematic configuration of a 3-terminal interconnectable star coupler, which is a component of an interconnectable star coupler having an arbitrary number of terminals.

FIG. 14 shows a star coupler to be used as a component to implement an interconnectable star coupler having an arbitrary number of terminals. The star coupler has a single optical equally distributing path 102 and two optical equally distributing paths 101 whose distribution ratios are generally the same, both paths being connected in a triangle form.

Figure 15A:
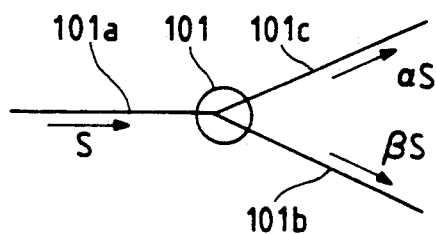
FIGS. 15 (a) and (b) are diagrams showing schematic configurations of an optical unequally distributing branch and an optical equally distributing branch implementing the 3-terminal interconnectable star coupler of FIG. 14, respectively.
Figure 15B:
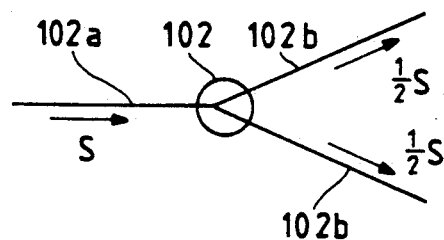

A structure of the optical unequally distributing branch 101 is shown in FIG. 15 (a). In FIG. 15 (a), an optical signal S injected from a terminal 101a is distributed to a terminal 101c as an output $\alpha S$ and to a terminal 101b as an output $\beta S$. Assuming that there is few loss, $\alpha + \beta = 1$. Let it be assumed that $\alpha > \beta$ and that the optical signal injected from the terminal 101b is distributed only to the terminal 101a, while that the signal injected from the terminal 101c is distributed only to the terminal 101a. In FIG. 14, the terminals 101b of the two optically unequally distributing branch 101 are connected to each other, while their terminals 101c are connected to the terminal 102b of the optical equally distributing branch 102.

According to the star coupler shown in FIG. 14, an optical signal injected to one of the terminals 101a is distributed in larger amounts to the terminal 102a than to the other terminal 101a. The optical signal injected to the terminal 102a is distributed equally to the two terminals 101a.

A structure of the optical equally distributing branch 102 is shown in FIG. 15 (b). An optical signal S injected from the terminal 102a is distributed to both terminals 102b by S/2, respectively.

Figure 16A:
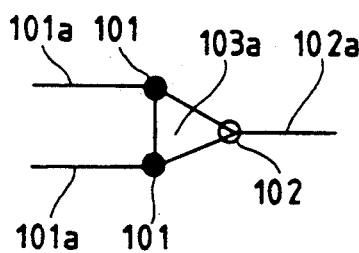
FIGS. 16 (a) and (b) are diagrams showing schematic configurations of 3-terminal interconnectable star couplers, one configured solely by a 3-terminal interconnectable star coupler formed of the components of FIG. 15 and one configured solely by a 3-terminal interconnectable star coupler formed of the optical equally distributing branch, respectively.
Figure 16B:
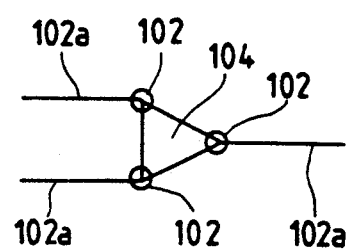
Figure 17A:
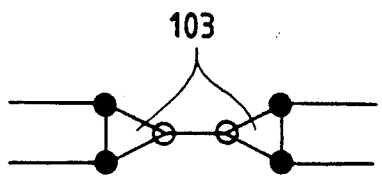
FIGS. 17 (a) to (f) are diagrams showing schematic configurations of 4- to 9-terminal interconnectable star couplers configured by using the components of FIG. 16, respectively.
Figure 17B:
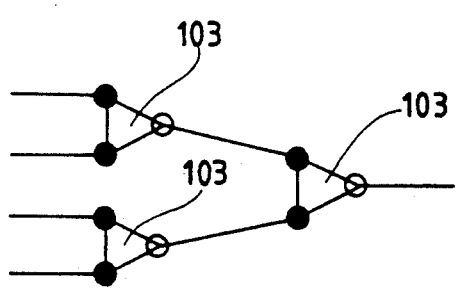
Figure 17C:
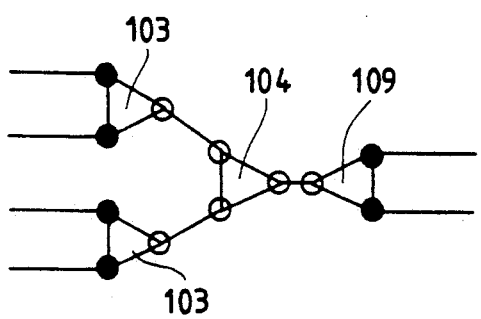
Figure 17D:
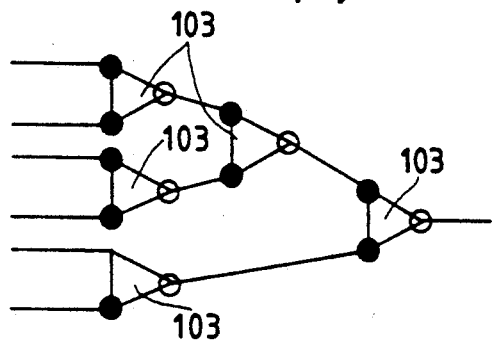
Figure 17E:
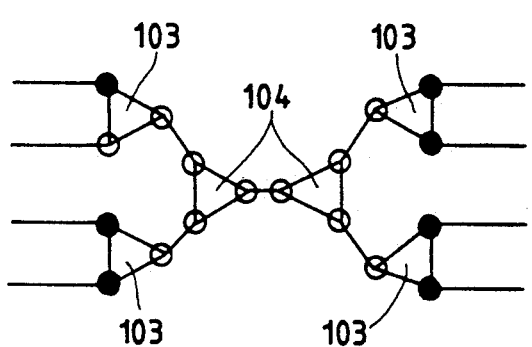
Figure 17F:
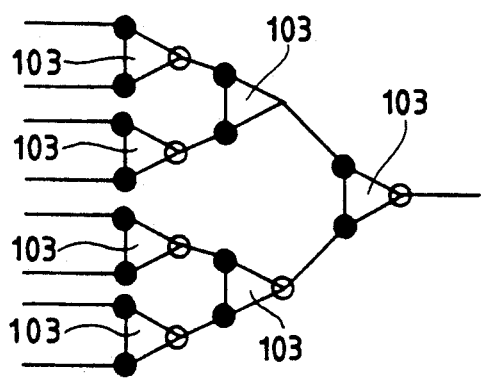

FIG. 16 (a) shows a schematic configuration of a 3-terminal interconnectable star coupler implemented by combining optical unequally distributing branch 101 and an optical equally distributing branch 102. FIG. 16 (b) shows a schematic configuration of a 3-terminal interconnectable star coupler implemented by connecting three optical equally distributing branch 102 so as to form a triangle.

Figure 18A:
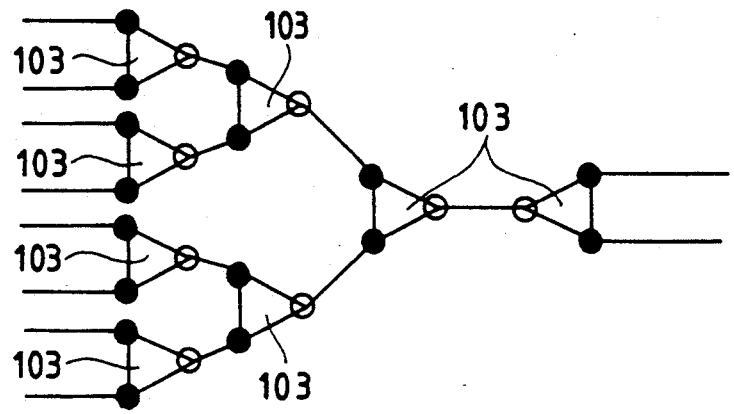
FIGS. 18 (a) to (c) are diagrams showing schematic configurations of 10- to 12-terminal interconnectable star couplers configured by the components of FIG. 16, respectively.
Figure 18B:
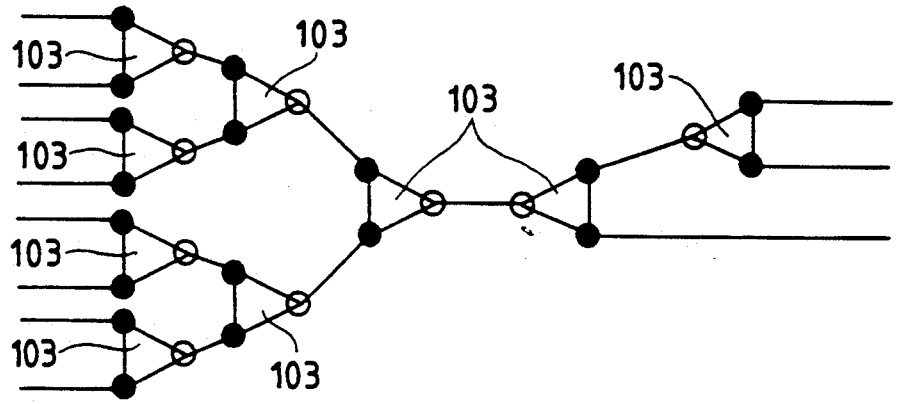
Figure 18C:
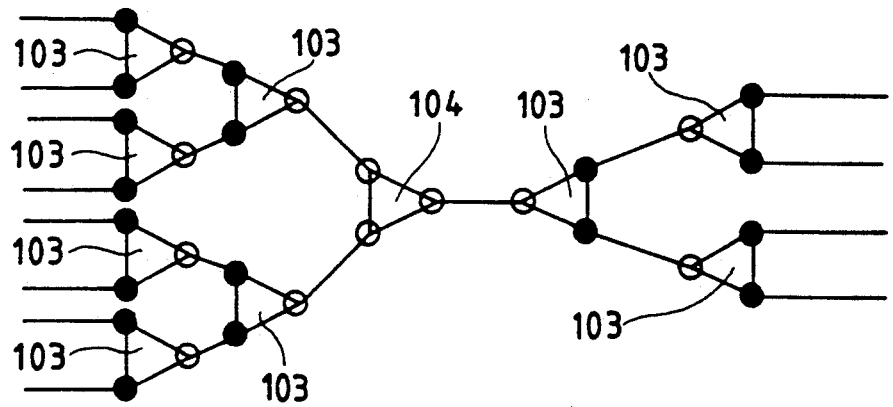

FIGS. 17 (a) to (f) show interconnectable star couplers having 4 to 9 terminals implemented by combining only the 3-terminal interconnectable star couplers 103 shown in FIG. 16 (a), or by combining the 3-terminal interconnectable star couplers 103 and the 3-terminal interconnectable star couplers 104 shown in FIG. 16 (b). Similarly, FIGS. 18 (a) to (c) show schematic configurations of interconnectable star couplers having 10 to 12 terminals. However, the distribution ratio $\alpha:\beta$ of each optical unequally distributing branch 101 is not necessarily the same in the above configurations. Their distribution ratios will be described later. In FIGS. 16 to 18 a solid black circle indicates the optical unequally distributing branch 101, while a white circle indicates the optical equally distributing branch 102.

Each of the aforesaid star couplers can be implemented as an optical integrated circuit using optical waveguides formed on an appropriate substrate.

Figure 19:
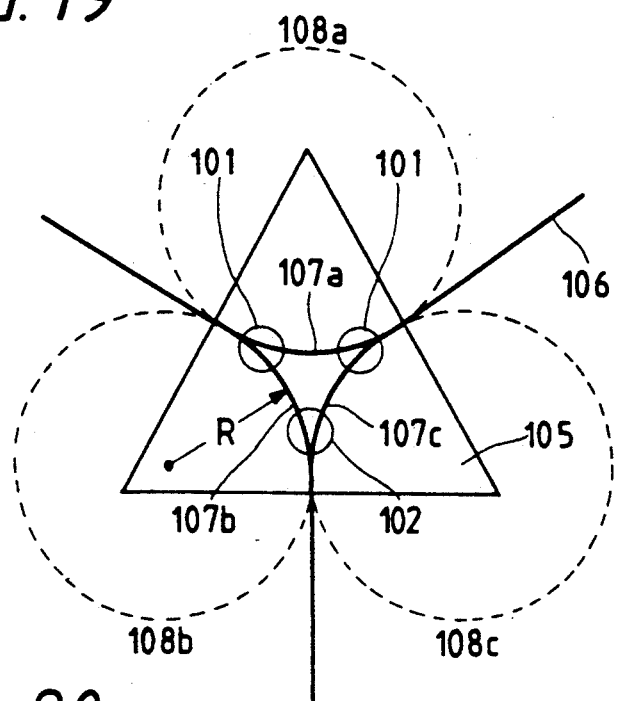
FIG. 19 is a plan view of a schematic configuration of the FIG. 14 star coupler implemented as an integrated circuit.

FIG. 19 shows an exemplary 3-terminal interconnectable star coupler configured as an optical integrated circuit. Optical waveguides 107a to 107c formed on a substrate 105 have shapes identical to the arcs of circles 108a to 108c, each having a radius R. An optical fiber 106 is connected to an end of each of the optical waveguides 107a to 107c. The star coupler shown in FIG. 19 is configured by arranging an optical unequally distributing branch 101 or an optical equally distributing branch 102 at the circumscribing point of each of the arcuate optical waveguides 107a to 107c. The configuration of FIG. 19 corresponds to the star coupler 103 shown in FIG. 16 (a).

According to the star coupler of FIG. 19, the area of a substrate required for the optical integrated circuit can be reduced. An optical fiber or an optical waveguide has a minimum bendable radius, assuming the presence of a certain radiation loss. If the star coupler of FIG. 14 is implemented under the condition that the optical waveguide is not bent at a radius of curvature smaller than the minimum radius, a star coupler such as shown in FIG. 19 is obtained.

If an interconnectable star coupler is implemented on an optical integrated circuit, using an optical waveguide formed on a glass or plastic substrate, photolithography-based batch production is possible, thus providing the advantage of facilitating the production. In this case, when the optical waveguides are made arcuate and the optical distributing paths are arranged at the circumscribing points of the optical waveguides, the area of a substrate necessary for forming an optical integrated circuit under a certain radiation loss can be reduced. Therefore, such implementation provides the advantage that the production of optical waveguides is facilitated and becomes inexpensive.

Figure 20:
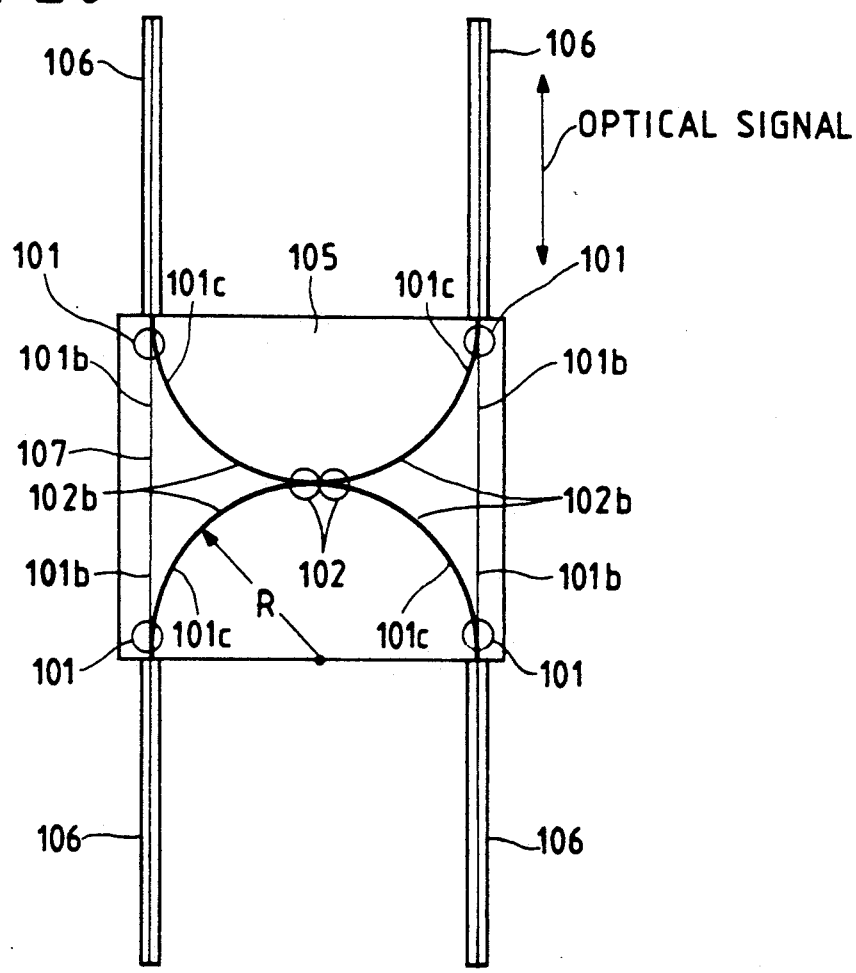
FIG. 20 is a plan view of a 4-terminal interconnectable star coupler implemented as an integrated circuit.
Figure 21A:
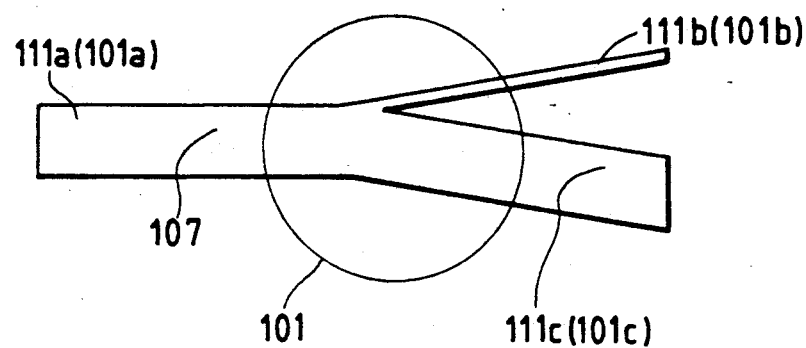
FIGS. 21 (a) and (b) are plan views of optical unequally distributing branch, one formed of optical waveguides and one formed of a directional coupler based on coupled mode theory, respectively.
Figure 21B:
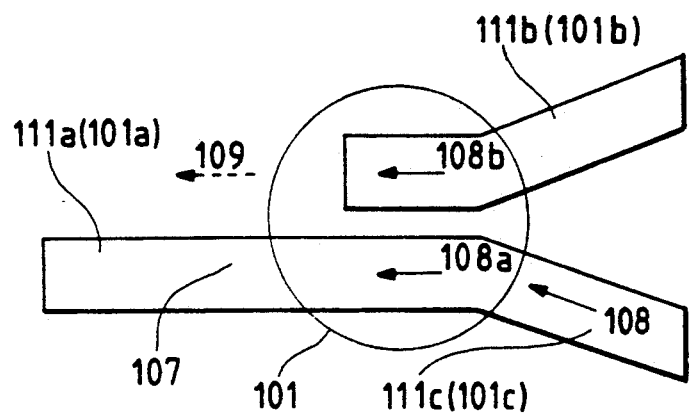

FIG. 20 shows an exemplary 4-terminal star coupler configured as an optical integrated circuit. This corresponds to the configuration of FIG. 17(a). An optical unequally distributing branch 101 and an optical equally distributing branch 102 have the structures shown in FIGS. 21 and 22, respectively. FIG. 21 (a) shows an optical unequally distributing branch 101 implemented by distributing into optical waveguides 111b (corresponding to the terminal 101b), 111c (corresponding to the terminal 101c). It is suitable mainly for forming an optical unequally distributing branch 101 using a multimode waveguide. Reference numeral 111a designates an optical waveguide corresponding to the terminal 101a.

FIG. 21 (b) shows an optical unequally distributing branch 101 formed of a directional coupler based on coupled mode theory. It is suitable mainly for implementing an optical unequally distributing path using a single-mode optical waveguide. When the optical unequally distributing branch is formed of a directional coupler based on coupled mode theory, no problem arises when an optical signal is distributed, but when the optical signals from the optical waveguides 111b, 111c flow into the optical waveguide 111a, a loss that is absent in the FIG. 21 (a) configuration will be caused. This is because, e.g., when an optical signal 108 is injected from the optical waveguide 111c of FIG. 21 to an optical unequally distributing branch 101, a part 108b of the optical signal 108 is distributed to the optical waveguide 111b, radiating such distributed optical signal from the optical waveguide 111c to the substrate as a loss component.

Figure 22:
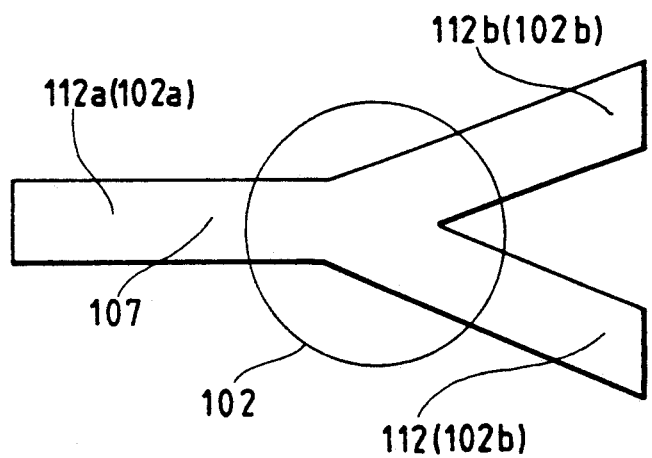
FIG. 22 is a plan view of an optical equally distributing branch formed of optical waveguides.

FIG. 22 shows a structure of the optical equally distributing branch 102. An optical signal from an optical waveguide 112a (corresponding to the terminal 102a) is equally distributed to two optical waveguides 112b (corresponding to the terminal 102b), each having the same width.

Figure 23:
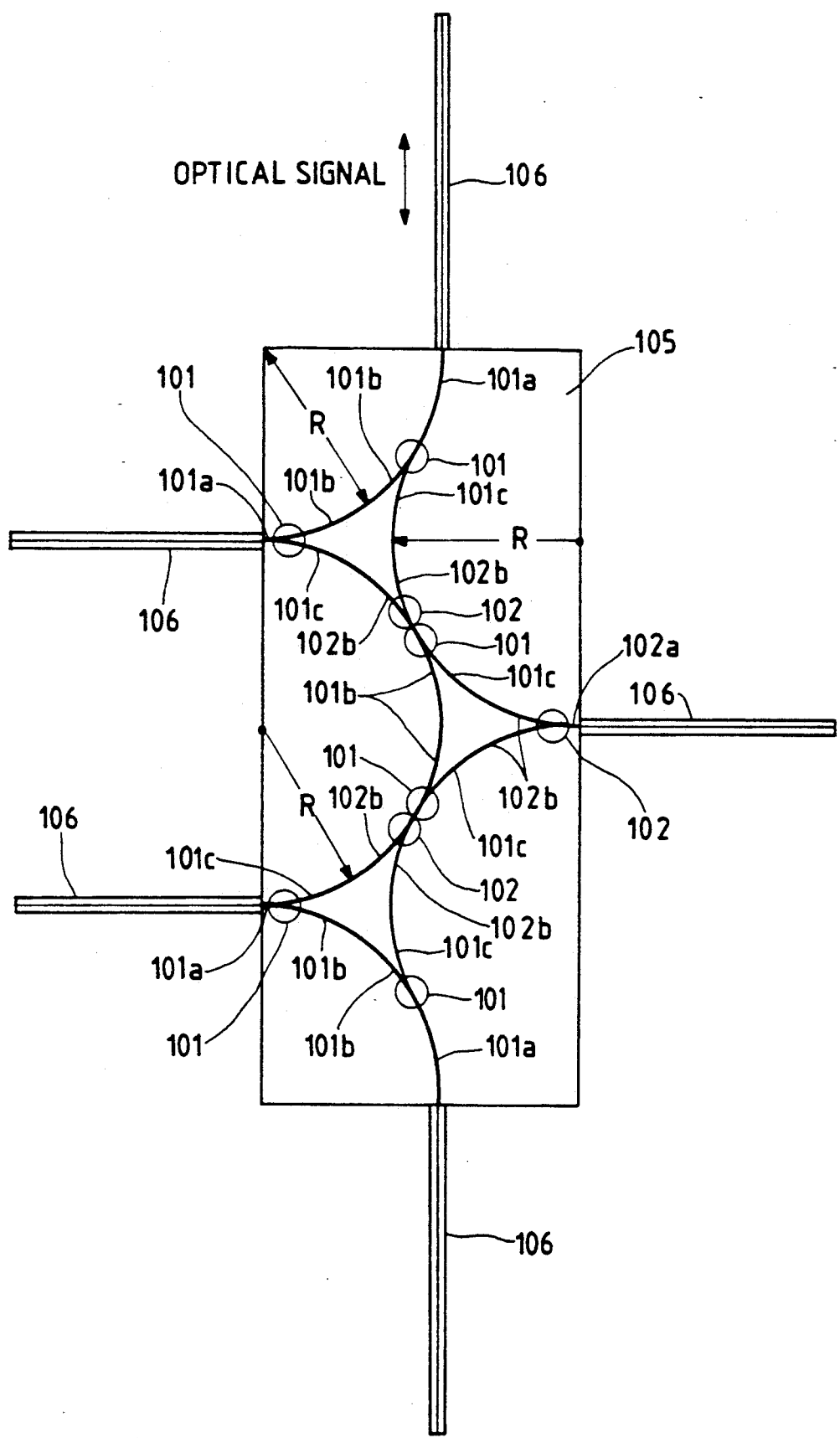
FIG. 23 is a plan view of a 5-terminal interconnectable star coupler implemented as an integrated circuit.

FIG. 23 is a plan view of a 5-terminal interconnectable star coupler. This corresponds to the configuration of FIG. 17 (b).

Figure 24:
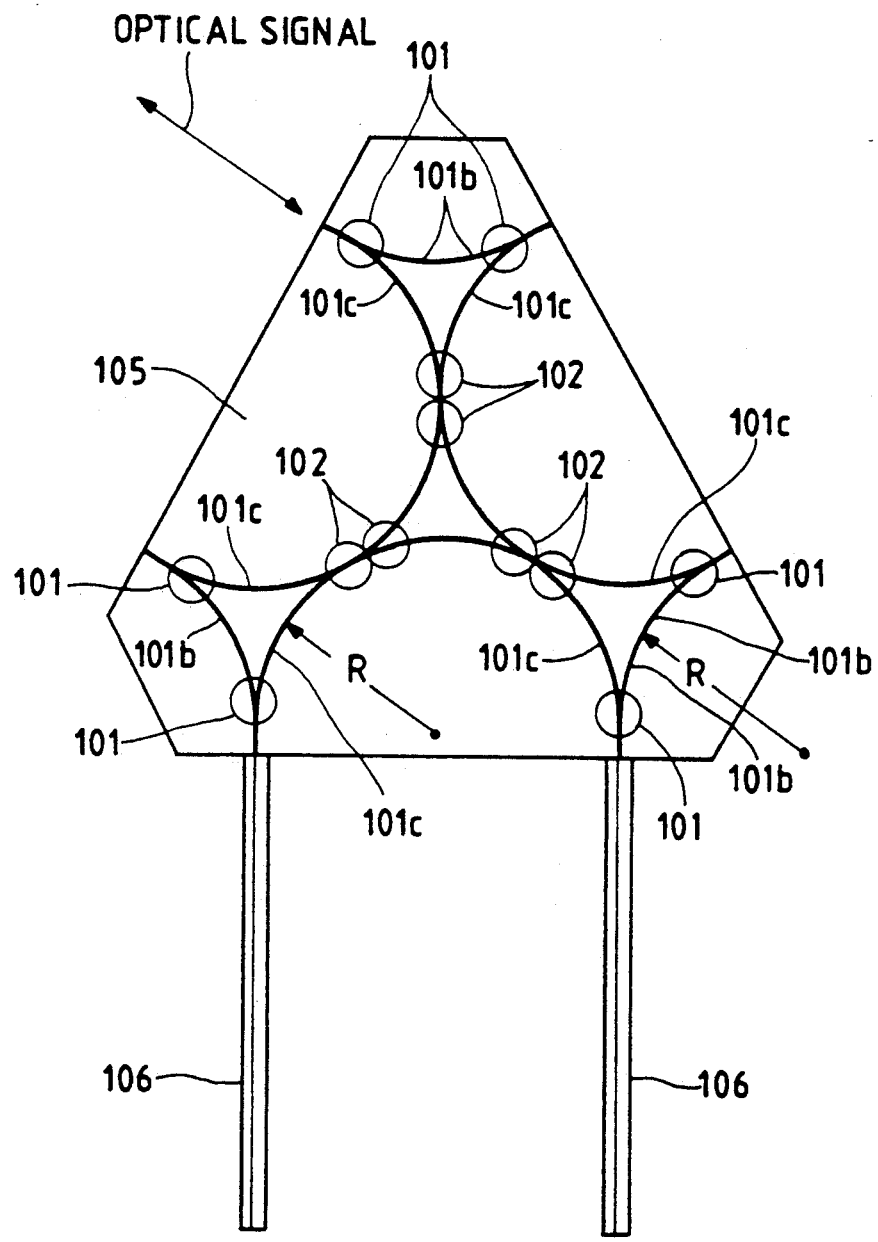
FIG. 24 is a plan view of a 6-terminal interconnectable star coupler implemented as an integrated circuit.
Figure 25:
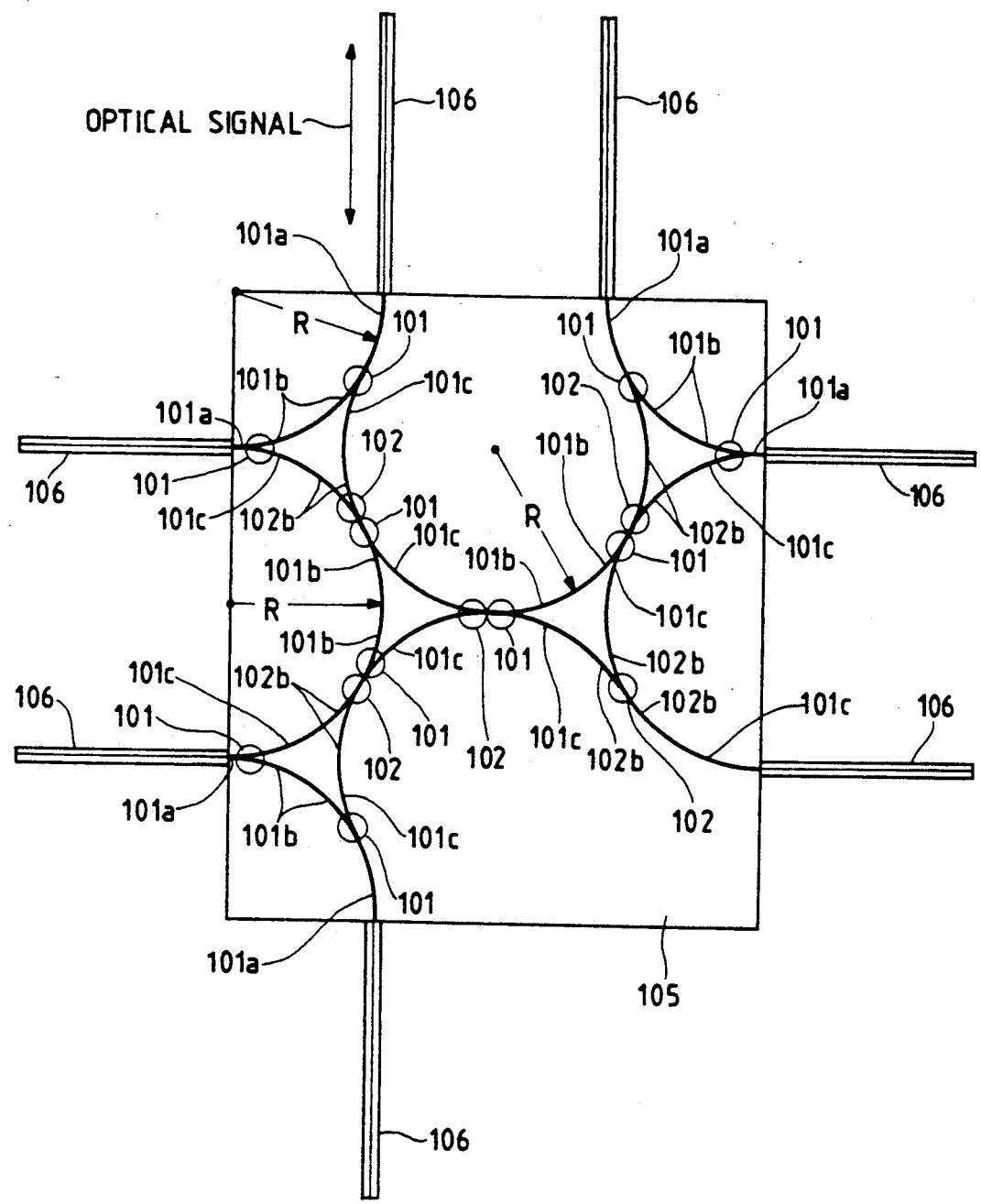
FIG. 25 is a plan view of a 7-terminal interconnectable star coupler implemented as an integrated circuit.
Figure 26:
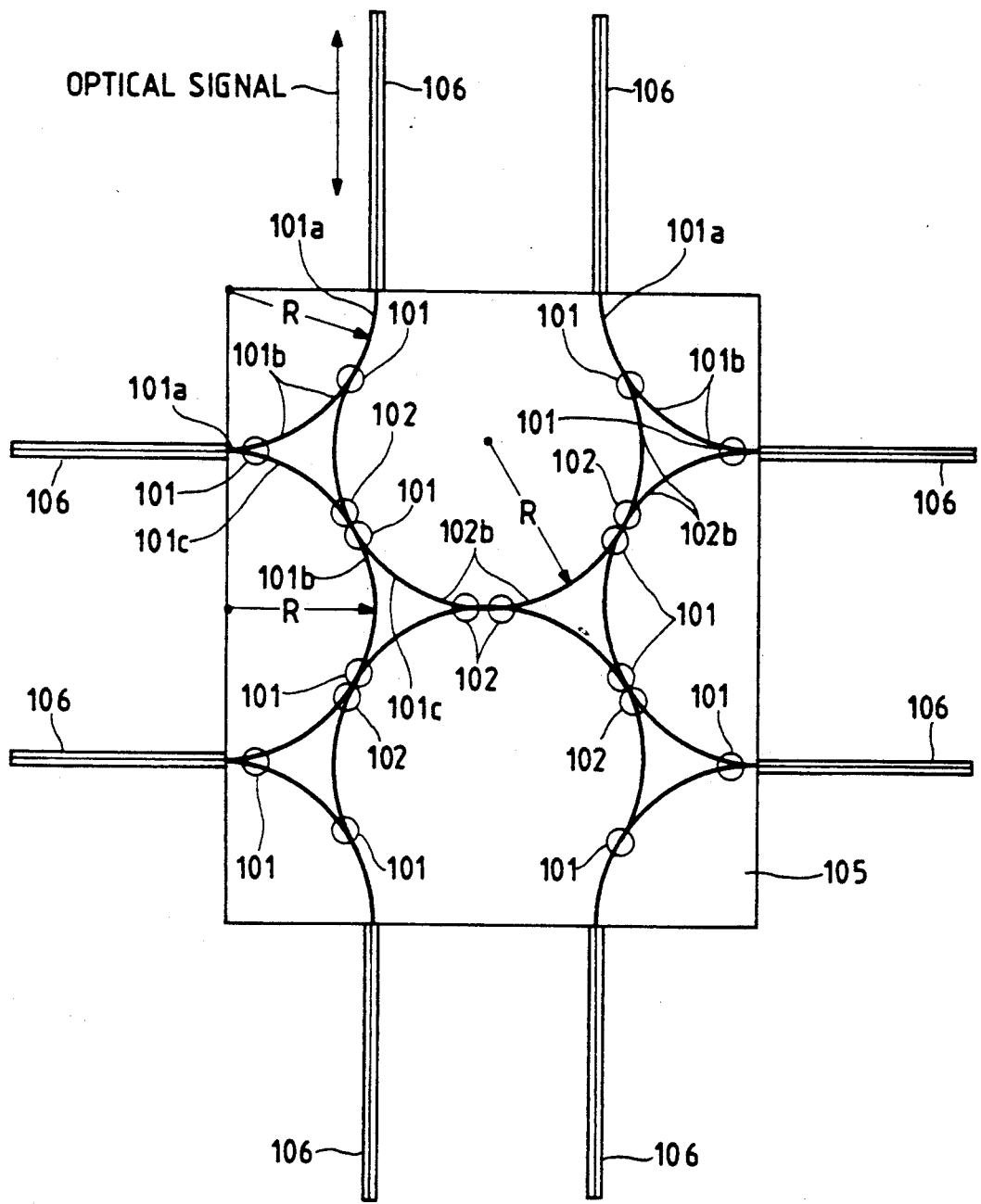
FIG. 26 is a plan view of an 8-terminal interconnectable star coupler implemented as an integrated circuit.
Figure 27:
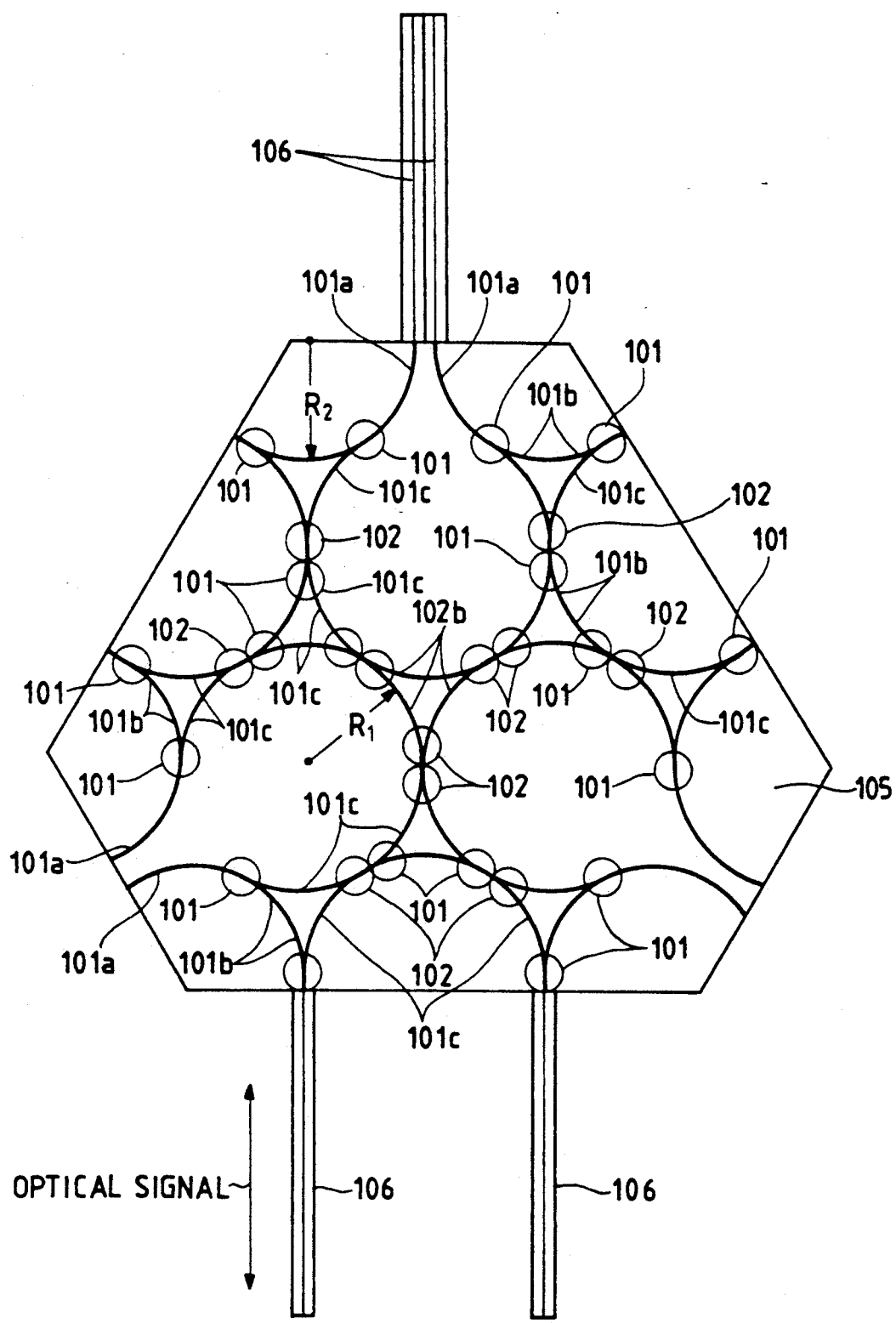
FIG. 27 is a plan view of a 12-terminal interconnectable star coupler implemented as an integrated circuit.

FIG. 24 (corresponding to FIG. 17 (c)) is a 6-terminal interconnectable star coupler; FIG. 25 (corresponding to FIG. 17 (d)) is a 7-terminal interconnectable star coupler; and FIG. 26 (corresponding to FIG. 17 (e)) is a 8-terminal interconnectable star coupler; and FIG. 27 (corresponding to FIG. 18 (c)) is a 12-terminal interconnectable star coupler. The 5-terminal star coupler of FIG. 23 is vertically symmetrical; the 6-terminal star coupler of FIG. 24 is horizontally symmetrical; the 8-terminal star coupler FIG. 26 is vertically and horizontally symmetrical; and the 12-terminal star coupler of FIG. 27 horizontally symmetrical. In the 6-terminal star coupler of FIG. 24 only two optical fibers 106 are shown and the other four fibers are omitted, while in the 12-terminal star coupler of FIG. 27 only four optical fibers 106 are shown and the other eight terminals are omitted.

As described previously, the embodiments can be fabricated by methods such as forming the optical waveguides while diffusing thallium (Tl) ions, etc., onto a glass substrate, or forming the optical waveguides while injecting ultraviolet rays onto a polycarbonate substrate and preparing a distribution of refractive indices by selective polymerization.

Distribution ratio design of the thus configured star couplers will be described next.

Figure 28A:
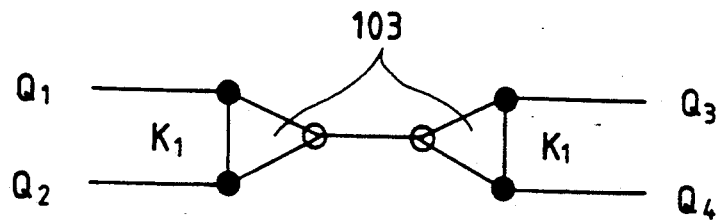
FIGS. 28 (a) to (c) are diagrams showing internal distribution ratios of multi-terminal interconnectable star couplers, respectively.
Figure 28B:
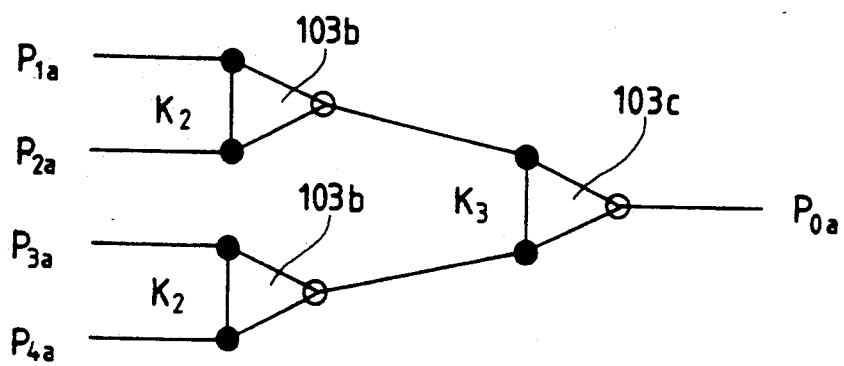
Figure 28C:
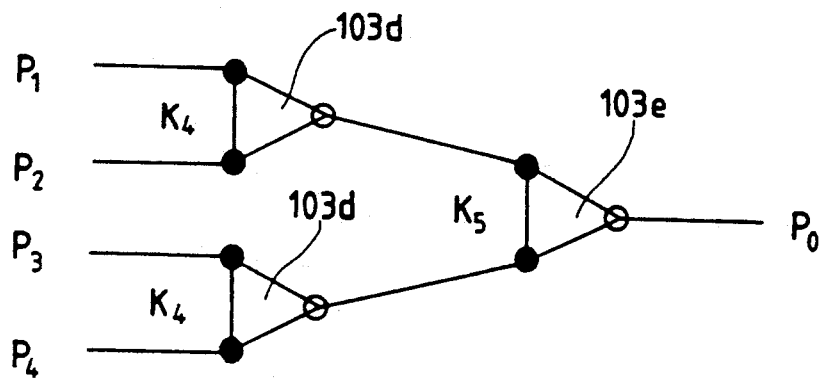

Assuming that the distribution ratios of two 3-terminal star couplers 103 constituting the 4-terminal star coupler shown in FIG. 17 (a) are respectively $K_1$, where $K_1 = \alpha/\beta$ for the aforesaid $\alpha$ and $\beta$ (see FIG. 15). FIG. 28 (a) shows this relationship. In FIGS. 28 (a) to (c), a solid black circle indicates the optical unequally distributing branch 101, and a white circle indicates the optical equally distributing branch 102. In FIG. 28 (a), input signals to terminals $Q_1$ to $Q_4$ are designated as $v_1$ to $v_4$, and output signals from the terminals $Q_1$ to $Q_4$ are designated as $w_1$ to $w_4$. If $K_1 = 2$, the following relationship is established between $v_1$ to $v_4$ and $w_1$ to $w_4$.

$$\begin{bmatrix} w_1 \\ w_2 \\ w_3 \\ w_4 \end{bmatrix} = \begin{bmatrix} 0 & 1/3 & 1/3 & 1/3 \\ 1/3 & 0 & 1/3 & 1/3 \\ 1/3 & 1/3 & 0 & 1/3 \\ 1/3 & 1/3 & 1/3 & 0 \end{bmatrix} \begin{bmatrix} v_1 \\ v_2 \\ v_3 \\ v_4 \end{bmatrix} \quad (12)$$

In the 5-terminal star coupler of FIG. 17 (b), if the distribution ratios of the star couplers 103b, 103c are set to $K_2 = 3$, $K_3 = 2$, respectively, as shown in FIG. 28 (b), then the following relationship can be established.

$$\begin{bmatrix} w_0 \\ w_1 \\ w_2 \\ w_3 \\ w_4 \end{bmatrix} = \begin{bmatrix} 0 & 1/4 & 1/4 & 1/4 & 1/4 \\ 1/4 & 0 & 1/4 & 1/4 & 1/4 \\ 1/4 & 1/4 & 0 & 1/4 & 1/4 \\ 1/4 & 1/4 & 1/4 & 0 & 1/4 \\ 1/4 & 1/4 & 1/4 & 1/4 & 0 \end{bmatrix} \begin{bmatrix} v_0 \\ v_1 \\ v_2 \\ v_3 \\ v_4 \end{bmatrix} \quad (13)$$

where input signals to terminals $P_{0a}$ to $P_{4a}$ are designated as $v_0$ to $v_4$, and output signals from $P_{0a}$ to $P_{4a}$ are designated as $w_0$ to $w_4$.

By designing the distribution ratio of a star coupler to an appropriate value in this way, a multi-terminal star coupler whose diagonal components are all zero and whose nondiagonal components are all equal in its transfer matrix can be configured. That such a multi-terminal star coupler is suitable for use in configuring an optical communication network has already been mentioned. The above embodiments use the configuration for the optical unequally distributing branch 101. Absorption losses and bend-induced radiation losses of the optical waveguides are not considered in the designing star couplers discussed above.

Further, by changing the distribution ratio of the star coupler 103, the transfer matrix of the multi-terminal star coupler can be changed as follows.

Assuming that the distribution ratios of star couplers 103d, 103e are $K_4 = 14$, $K_5 = 6$, respectively, as shown in FIG. 28 (c), the following relationship can be established.

$$\begin{bmatrix} w_0 \\ w_1 \\ w_2 \\ w_3 \\ w_4 \end{bmatrix} = \begin{bmatrix} 0 & 12/15 & 12/15 & 12/15 & 12/15 \\ 1/4 & 0 & 1/15 & 1/15 & 1/15 \\ 1/4 & 1/15 & 0 & 1/15 & 1/15 \\ 1/4 & 1/15 & 1/15 & 0 & 1/15 \\ 1/4 & 1/15 & 1/15 & 1/1 & 0 \end{bmatrix} \begin{bmatrix} v_0 \\ v_1 \\ v_2 \\ v_3 \\ v_4 \end{bmatrix} \quad (14)$$

Figure 29:
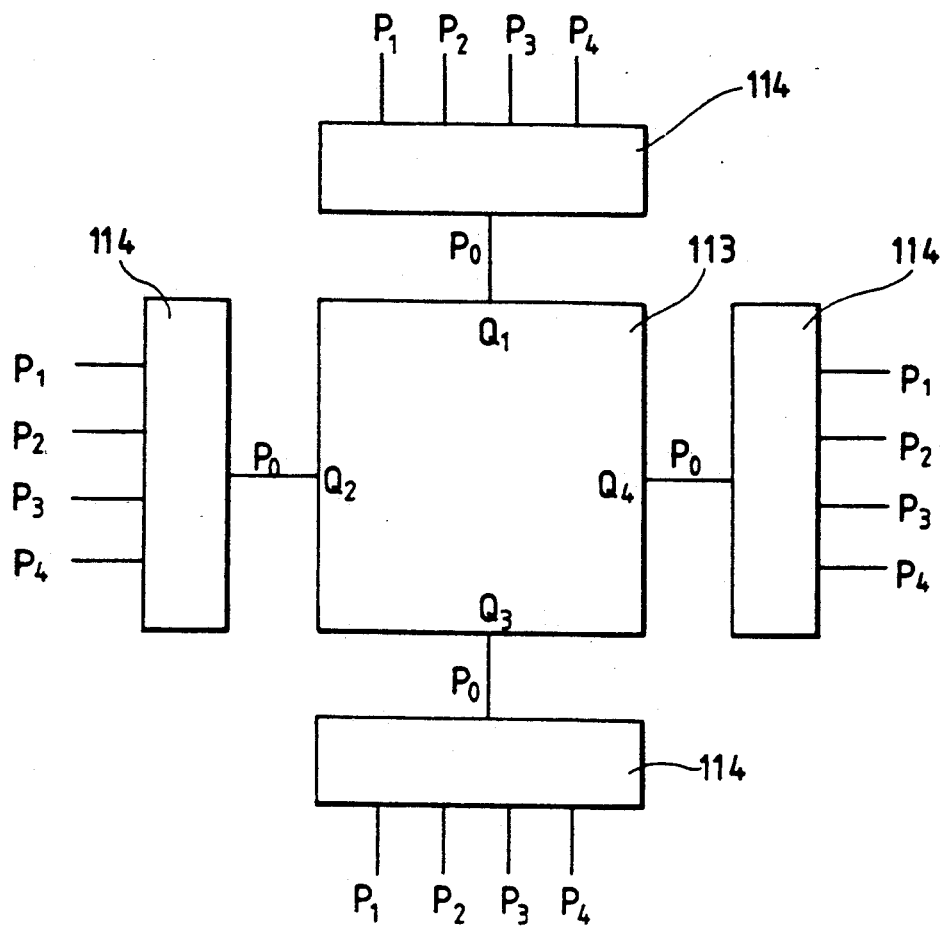
FIG. 29 is a diagram showing a network configured by connecting the terminals of star couplers, each of which has the internal distribution ratio shown in FIG. 28(c), to the terminals of a 4-terminal interconnectable star coupler, respectively.
Figure 30:
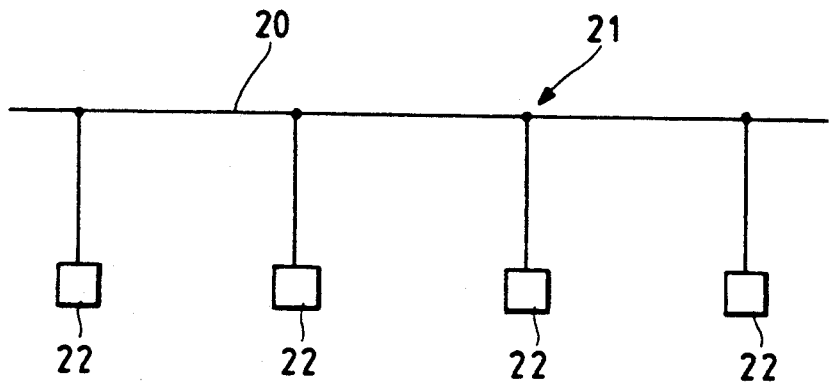
FIG. 30 is a diagram showing an Ethernet-based network.
Figure 31:
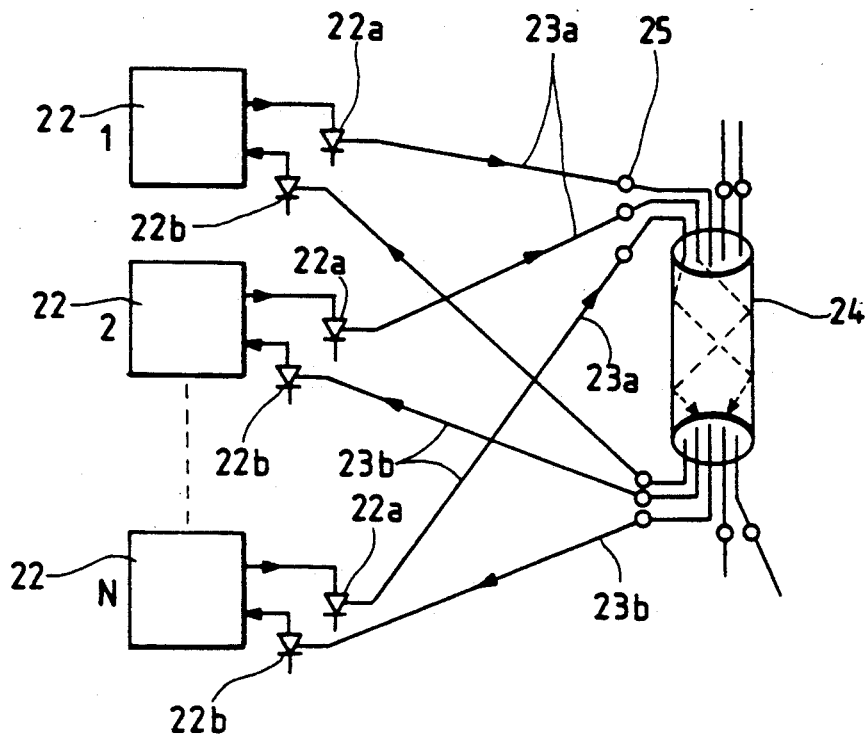
FIG. 31 is a diagram showing a network configured by a star coupler using a mixing rod.
Figure 32:
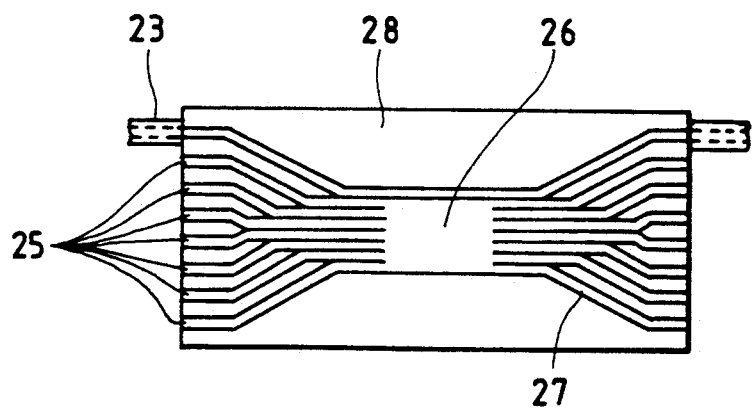
FIG. 32 is a plan view of a conventional star coupler implemented on a glass substrate.
Figure 33:
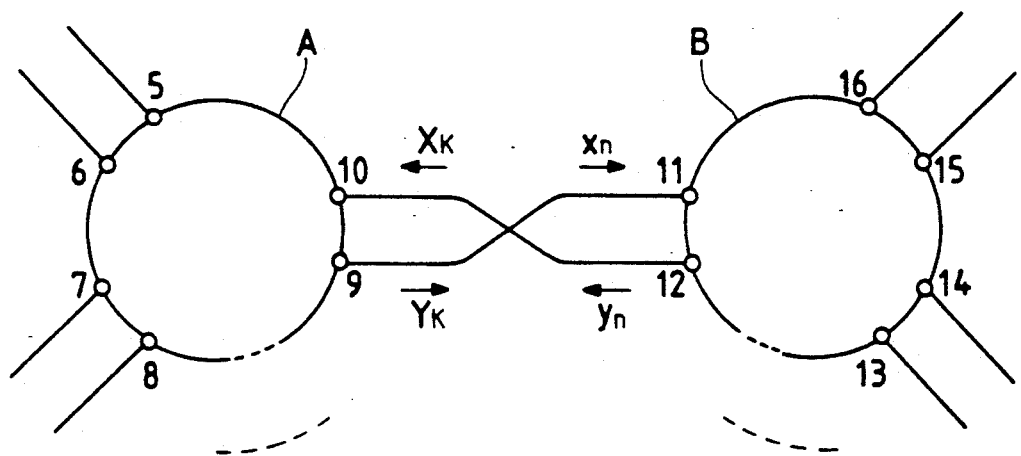
FIG. 33 is a diagram showing that two conventional star couplers are connected.
Figure 34:
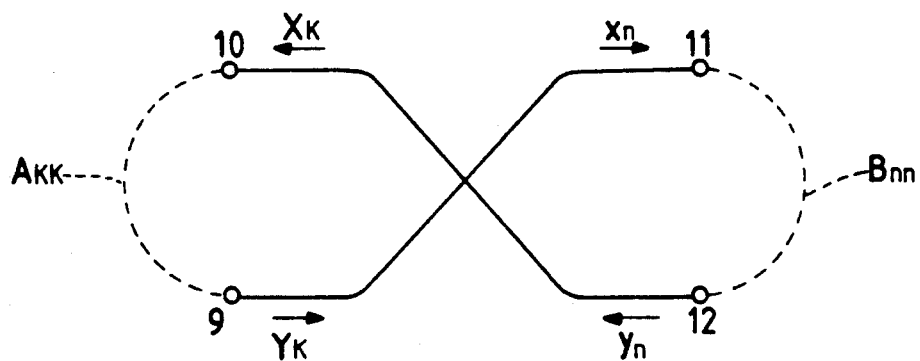
FIG. 34 is a diagram illustrative of circulation of signals when two conventional star couplers are connected.

Such a star coupler is used as shown in FIG. 29. That is, terminals $P_0$ of the four 5-terminal star couplers are connected to the terminals of a star coupler 113, making it equivalent to a 16-terminal interconnectable star coupler as a whole. In FIG. 29, the terminals $Q_1$ to $Q_4$ of the 4-terminal star coupler 113 correspond to the terminals $Q_1$ to $Q_4$ of FIG. 28 (a), respectively. Each 5-terminal star coupler 114 is so designed that its distribution ratio is as shown in FIG. 28 (c). The terminals $P_0$ to $P_4$ of the 5-terminal star coupler 114 corresponds to $P_0$ to $P_4$ of FIG. 28 (c).

When configured as such, the network of FIG. 29 is equivalent to a star coupler whose diagonal components are all zero and whose nondiagonal components are equal in the transfer matrix of the 16 terminals. In actually configuring a network, it is practical to form the core of the network by connecting the star coupler 113 through link amplifiers and to distribute an optical signal to nodes through the star couplers 114. This configuration requires shorter optical fiber cables than a network configured by arranging a multi-terminal (e.g., 16-terminal) star coupler at the center.

Based on the concept utilized in the above embodiments, an interconnectable star coupler having a number of terminals other than the above examples can be configured. Therefore, it goes without saying that such interconnectable star couplers are included within the scope of the invention.

The term of "directional optical coupler" in the claims means a passive element that distributes and synthesizes a light beam in broad sense. The optical distributing branch, the optical distributing/synthesizing unit and directional optical coupler based on coupled mode theory are included in the directional optical couplers.

As described in the foregoing, the invention allows nodes to be connected by a single terminal. In addition, network expansion can be implemented easily by interconnecting the star couplers. The function of bidirectional communication is also possible with the invention, thereby permitting collision detection. Connection between a node and a star coupler or connection between star couplers can be implemented by a single terminal, thereby contributing to reducing the number of components involved to configure a network, such as optical fibers, connectors, and link amplifiers, substantially by half. Further, by designing the nondiagonal components of the transfer matrix of a star coupler, gains of the link amplifiers can be made equal to one another.

Still further, the invention implements an interconnectable star coupler having an arbitrary number of terminals. There is a certain degree of freedom in changing the value of nondiagonal components in the transfer matrix.

The other embodiment of the present invention will be described with reference to FIG. 38 which is a schematic diagram showing the other embodiment of a star coupler according to the present invention. This half coupler implements the distribution of an optical signal shown in FIGS. 35 and 36 using a 1×2 optical equally distributing/synthesizing unit 203, 1×2 optical unequally distributing/synthesizing units 204, 2×2 optical unequally distributing units 205, and optical waveguides 211 to 218 formed on a substrate 202. Reference character R in FIG. 38 designates a radius of curvature of the waveguides. The expression "1×2" means that, with respect to a single optical path on one terminal side, there are two optical paths on the other terminal side.

An optical signal 201 inputted from a terminal $P_1$ through an optical fiber 206 is partially distributed to a terminal $P_2$ via the 1×2 optical unequally distributing/synthesizing units 204; partially distributed to terminals $P_3$, $P_4$ via the 2×2 optical unequally distributing units 205 thereafter; and is transmitted to a terminal $P_0$ via the 1×2 optical equally distributing/synthesizing unit 203. Reference characters $x_n$, $y_n$ in FIG. 38 designate input and output components, respectively.

Figure 39:
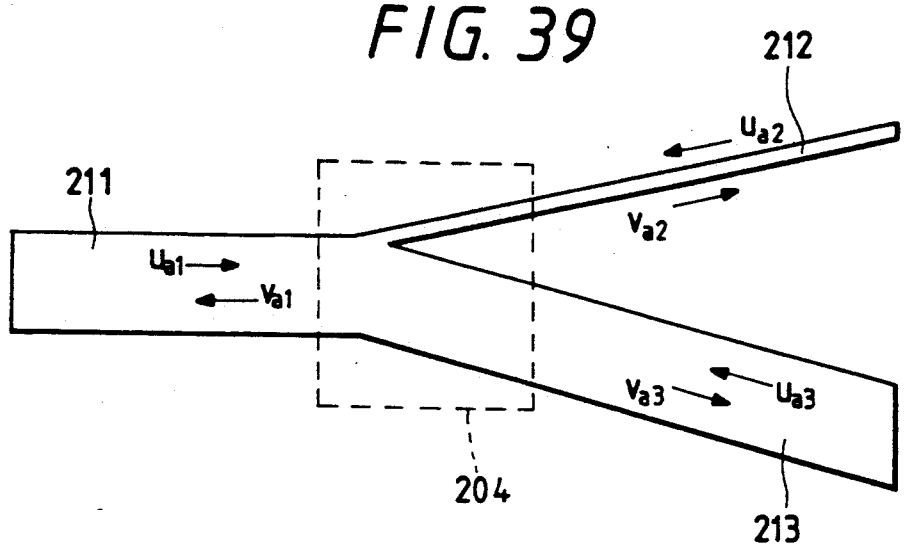
FIG. 39 is a plan view of a 1×2 optical unequally distributing/synthesizing unit.
Figure 40:
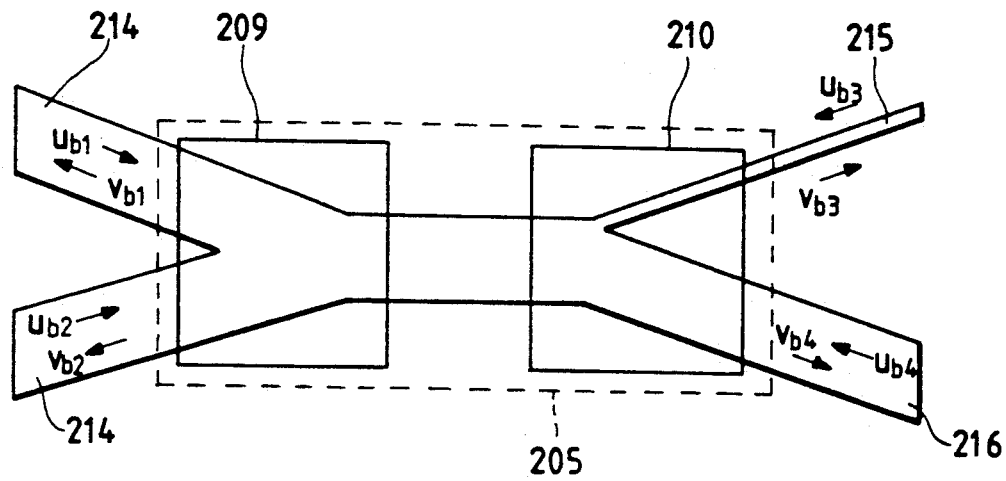
FIG. 40 is a plan view of a 2×2 optical unequally distributing unit.
Figure 41:
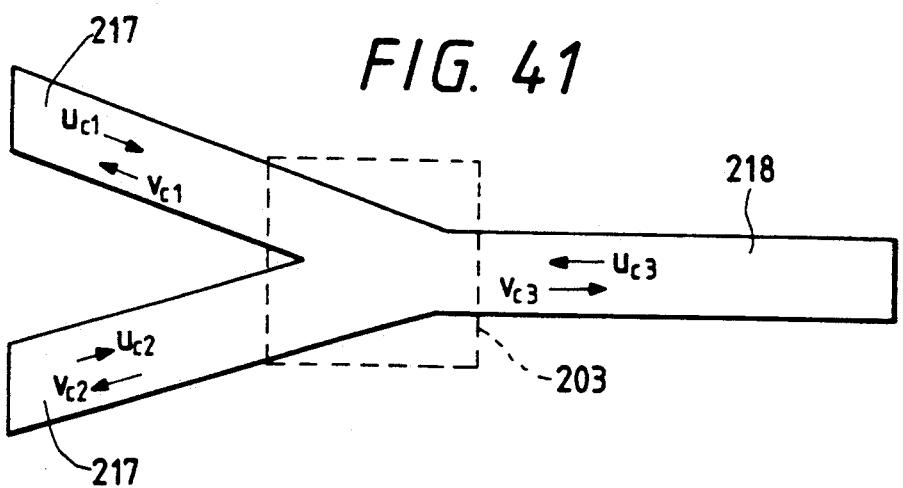
FIG. 41 is a plan view of a 1×2 optical equally distributing/synthesizing unit.

FIG. 39 shows a structure of the 1×2 optical unequally distributing/synthesizing unit 204, FIG. 40 shows a structure of the 2×2 optical unequally distributing unit 205, and FIG. 41 shows a structure of the 1×2 optical equally distributing/synthesizing unit 203.

The 2×2 optical unequally distributing unit 205 shown in FIG. 40 consists of a 1×2 optical equally distributing/synthesizing unit 209 and a 1×2 optical unequally distributing/synthesizing unit 210.

Assuming that optical input signals to the respective terminals of the 1×2 optical unequally distributing/synthesizing unit 204 are designated as $u_{a1}$, $u_{a2}$, $u_{a3}$ and optical output signals from their respective terminals are designated as $v_{a1}$, $v_{a2}$, $v_{a3}$ as shown in FIG. 39, the following equation is established.

$$\begin{bmatrix} v_{a1} \\ v_{a2} \\ v_{a3} \end{bmatrix} = \begin{bmatrix} 0 & 1 & 1 \\ 1/(Ra+1) & 0 & 0 \\ Ra/(Ra+1) & 0 & 0 \end{bmatrix} \begin{bmatrix} u_{a1} \\ u_{a2} \\ u_{a3} \end{bmatrix} \quad (15)$$

Reference character Ra in equation (15) is the distribution ratio of the optical unequally distributing/synthesizing unit. For example, in FIG. 39, it is the ratio at the time the optical signal $u_{a1}$ is distributed into $v_{a2}$ and $v_{a3}$, and it is defined as $v_{a3}:v_{a2}=Ra:1$. Unless otherwise specified, the distribution ratio will take a value larger than 1.

Similarly assuming that optical input and output signals to and from the terminals of the 2×2 optical unequally distributing unit 205 are designated as $u_{b1}$, $u_{b2}$, $u_{b3}$, $u_{b4}$, and $v_{b1}$, $v_{b2}$, $v_{b3}$, $v_{b4}$, respectively, as shown in FIG. 40, the following equation is established.

$$\begin{bmatrix} v_{b1} \\ v_{b2} \\ v_{b3} \\ v_{b4} \end{bmatrix} = \begin{bmatrix} 0 & 0 & 1/2 & 1/2 \\ 0 & 0 & 1/2 & 1/2 \\ 1/(Rb+1) & 1/(Rb+1) & 0 & 0 \\ Rb/(Rb+1) & Rb/(Rb+1) & 0 & 0 \end{bmatrix} \begin{bmatrix} u_{b1} \\ u_{b2} \\ u_{b3} \\ u_{b4} \end{bmatrix} \quad (16)$$

Reference character Rb in equation (16) is the distribution ratio of the optical unequally distributing unit.

Similarly assuming that optical input and output signals to the respective terminals of the 1×2 optical equally distributing/synthesizing unit 203 are designated as $u_{c1}$, $u_{c2}$, $u_{c3}$, and $v_{c1}$, $v_{c2}$, $v_{c3}$, respectively, as shown in FIG. 41, the following equation is established.

$$\begin{bmatrix} v_{c1} \\ v_{c2} \\ v_{c3} \end{bmatrix} = \begin{bmatrix} 0 & 0 & 1/2 \\ 0 & 0 & 1/2 \\ 1 & 1 & 0 \end{bmatrix} \begin{bmatrix} u_{c1} \\ u_{c2} \\ u_{c3} \end{bmatrix} \quad (17)$$

Figure 42:
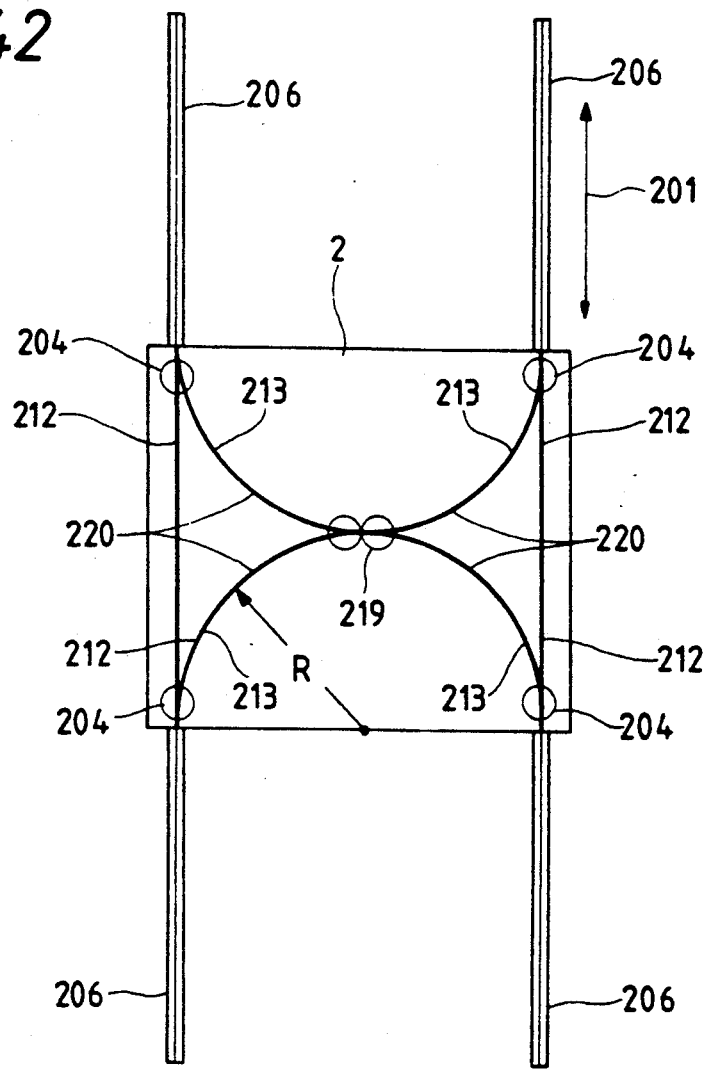
FIG. 42 is a plan view of a 4-terminal star be used in an optical communication network of the invention.
Figure 43:
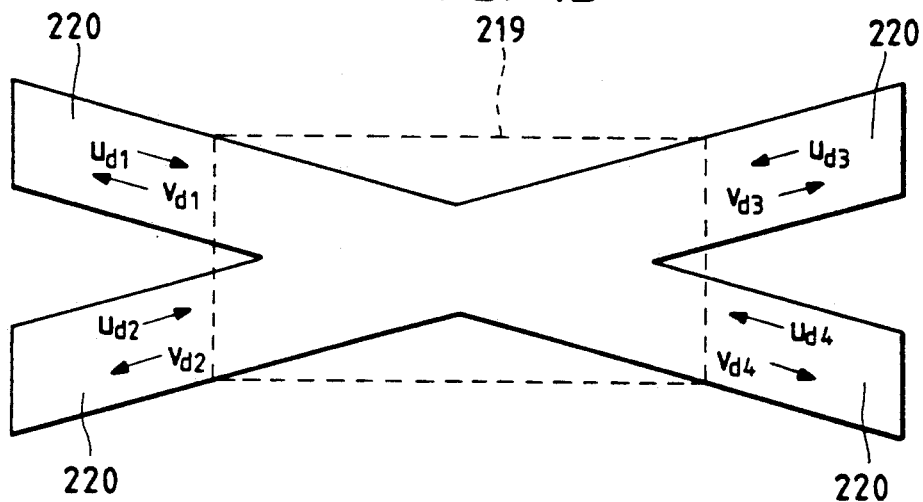
FIG. 43 is a plan view of a 2×2 optical equally distributing unit used in the 4-terminal star coupler of FIG. 8.

FIG. 42 shows an embodiment of a 4-terminal full coupler, configured by combining the 1×2 optical unequally distributing/synthesizing units 204 of FIG. 39 and a 2×2 optical equally distributing unit 219 of FIG. 43. Assuming that optical input and output signals to the respective terminals of the 2×2 optical equally distributing unit 219 are designated as $u_{d1}$, $u_{d2}$, $u_{d3}$, $u_{d4}$, and $v_{d1}$, $v_{d2}$, $v_{d3}$, $v_{d4}$, respectively, as shown in FIG. 43, the following equation is established.

$$\begin{bmatrix} v_{d1} \\ v_{d2} \\ v_{d3} \\ v_{d4} \end{bmatrix} = \begin{bmatrix} 0 & 0 & 1/2 & 1/2 \\ 0 & 0 & 1/2 & 1/2 \\ 1/2 & 1/2 & 0 & 0 \\ 1/2 & 1/2 & 0 & 0 \end{bmatrix} \begin{bmatrix} u_{d1} \\ u_{d2} \\ u_{d3} \\ u_{d4} \end{bmatrix} \quad (18)$$

In the FIG. 42 configuration, the transfer characteristic of the 4-terminal full coupler can be expressed as follows, assuming that the distribution ratio Ra of the 1×2 optical unequally distributing/synthesizing unit 204 is 2.

$$\begin{bmatrix} y_1 \\ y_2 \\ y_3 \\ y_4 \end{bmatrix} = \begin{bmatrix} 0 & 1/3 & 1/3 & 1/3 \\ 1/3 & 0 & 1/3 & 1/3 \\ 1/3 & 1/3 & 0 & 1/3 \\ 1/3 & 1/3 & 1/3 & 0 \end{bmatrix} \begin{bmatrix} x_1 \\ x_2 \\ x_3 \\ x_4 \end{bmatrix} \quad (19)$$

where $x_1$, $x_2$, $x_3$, $x_4$ are the input signals of and $y_1$, $y_2$, $y_3$, $y_4$ are the output signals of the respective terminals of the 4-terminal full coupler of FIG. 42.

Figure 44:
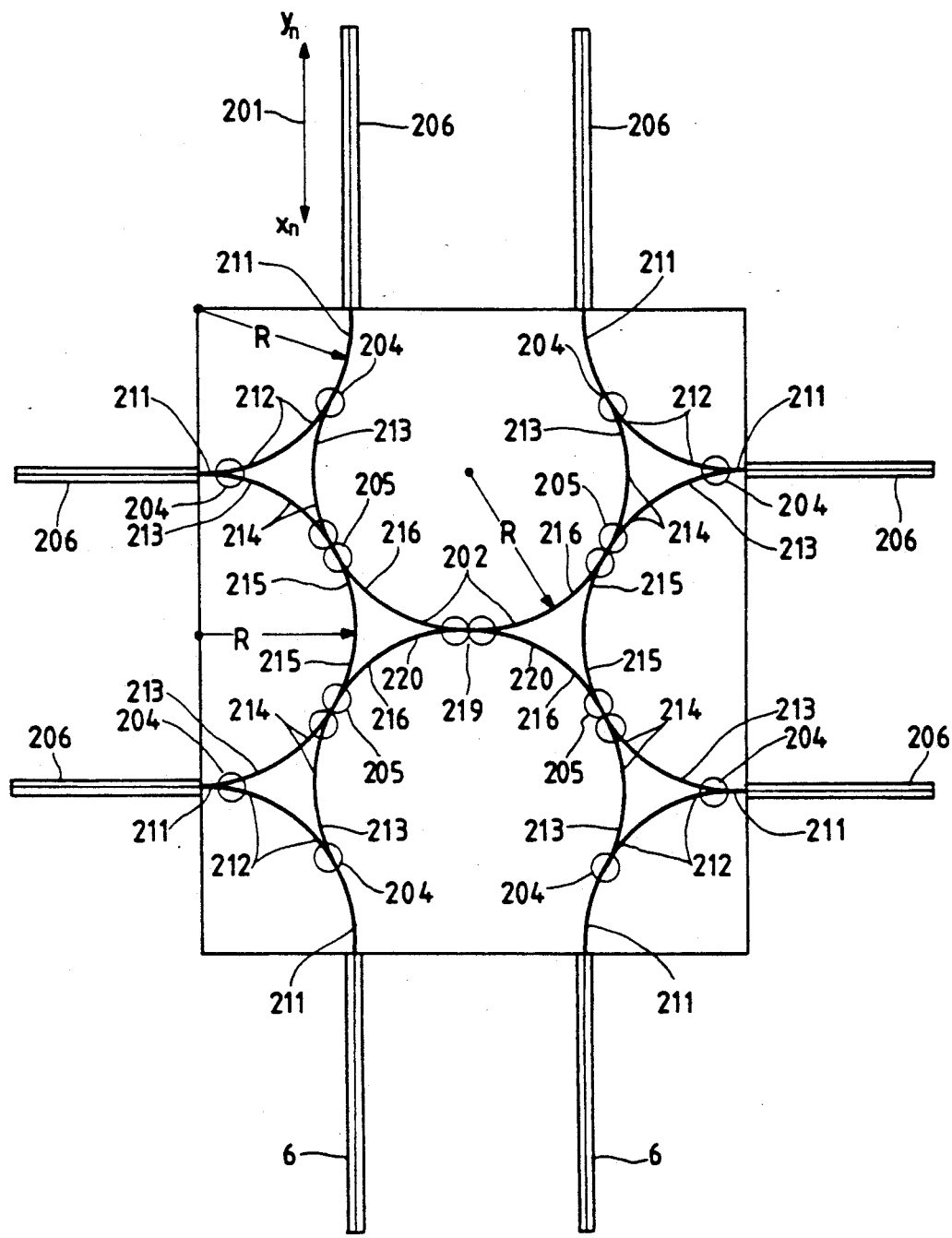
FIG. 44 is a plan view of an 8-terminal interconnectable star coupler used in an optical communication network of the invention.

An 8-terminal full coupler can be configured in a manner similar to the 4-terminal full coupler. FIG. 44 shows an embodiment of an 8-terminal full coupler, which is configured by combining the components of FIGS. 39, 40, and 43, i.e., the 1×2 optical unequally distributing/synthesizing units 204, the 2×2 optical unequally distributing units 205, and the 2×2 optical unequally distributing unit 219.

In the FIG. 44 configuration, assuming that the distribution ratio Ra of the 1×2 optical unequally distributing/synthesizing unit 204 is 6, and that the distribution ratio Rb of the 2×2 optical unequally distributing unit 205 is 2, then the transfer characteristic of the 8-terminal full coupler of FIG. 44 is expressed by the following equation.

$$\begin{bmatrix} y_1 \\ y_2 \\ y_3 \\ y_4 \\ y_5 \\ y_6 \\ y_7 \\ y_8 \end{bmatrix} = \begin{bmatrix} 0 & 1/7 & 1/7 & 1/7 & 1/7 & 1/7 & 1/7 & 1/7 \\ 1/7 & 0 & 1/7 & 1/7 & 1/7 & 1/7 & 1/7 & 1/7 \\ 1/7 & 1/7 & 0 & 1/7 & 1/7 & 1/7 & 1/7 & 1/7 \\ 1/7 & 1/7 & 1/7 & 0 & 1/7 & 1/7 & 1/7 & 1/7 \\ 1/7 & 1/7 & 1/7 & 1/7 & 0 & 1/7 & 1/7 & 1/7 \\ 1/7 & 1/7 & 1/7 & 1/7 & 1/7 & 0 & 1/7 & 1/7 \\ 1/7 & 1/7 & 1/7 & 1/7 & 1/7 & 1/7 & 0 & 1/7 \\ 1/7 & 1/7 & 1/7 & 1/7 & 1/7 & 1/7 & 1/7 & 0 \end{bmatrix} \begin{bmatrix} x_1 \\ x_2 \\ x_3 \\ x_4 \\ x_5 \\ x_6 \\ x_7 \\ x_8 \end{bmatrix} \quad (20)$$

The distribution ratio of the half coupler must be changed depending on the full coupler to be combined therewith. When combining with a 4-terminal full coupler, the transfer matrix of the 4-terminal half coupler is derived as follows from equations (7) and (8).

$$\begin{bmatrix} y_0 \\ y_1 \\ y_2 \\ y_3 \\ y_4 \end{bmatrix} = \begin{bmatrix} 0 & 12/1 & 12/1 & 12/1 & 12/1 \\ 1/4 & 1/15 & 1/15 & 1/15 & 1/15 \\ 1/4 & 0 & 1/15 & 1/15 & 1/15 \\ 1/4 & 1/15 & 0 & 1/15 & 1/15 \\ 1/4 & 1/15 & 1/15 & 0 & 1/15 \end{bmatrix} \begin{bmatrix} x_0 \\ x_1 \\ x_2 \\ x_3 \\ x_4 \end{bmatrix} \quad (21)$$

To obtain the characteristic shown in equation (21), it is understood from calculation that the distribution ratio Ra of the 1×2 optical unequally distributing/synthesizing unit 204 may be selected to 214 and that the distribution ratio Rb of the 2×2 optical unequally distributing unit 205 may be selected to 6. Similarly, when combining with an 8-terminal full coupler, the transfer matrix of the 4-terminal half coupler is derived as follows from equations (7) and (8).

$$\begin{bmatrix} y_0 \\ y_1 \\ y_2 \\ y_3 \\ y_4 \end{bmatrix} = \begin{bmatrix} 0 & 28/3 & 28/3 & 28/3 & 28/3 \\ 1/4 & 1/31 & 1/31 & 1/31 & 1/31 \\ 1/4 & 0 & 1/31 & 1/31 & 1/31 \\ 1/4 & 1/31 & 0 & 1/31 & 1/31 \\ 1/4 & 1/31 & 1/31 & 0 & 1/31 \end{bmatrix} \begin{bmatrix} x_0 \\ x_1 \\ x_2 \\ x_3 \\ x_4 \end{bmatrix} \quad (22)$$

To obtain the characteristic shown in equation (22), it is understood from calculation that the distribution ratio Ra of the 1×2 optical unequally distributing/synthesizing unit 204 may be selected to 30 and that the distribution ratio Rb of the 2×2 optical unequally distributing unit 205 may be selected to 14.

Figure 38:
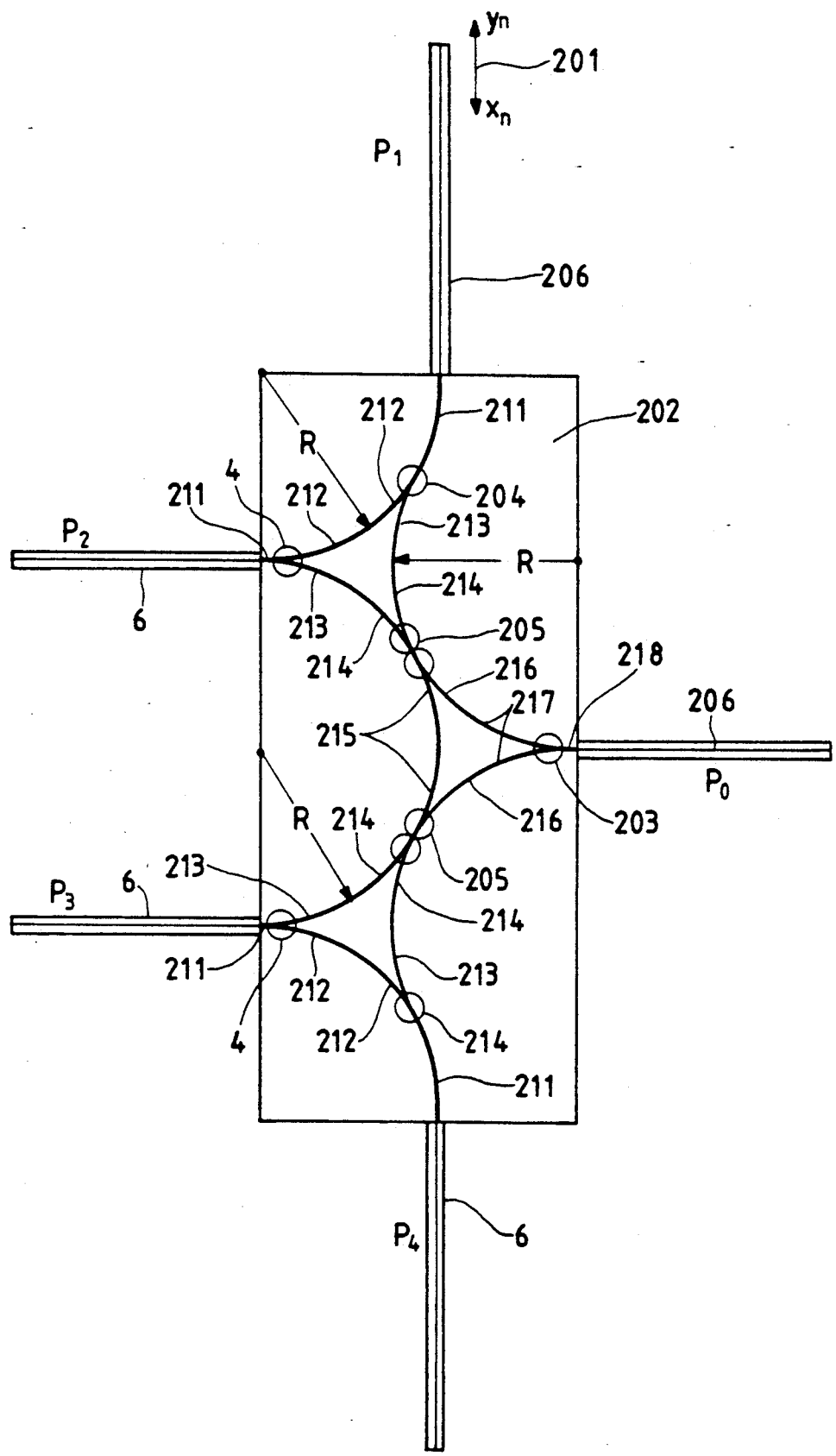
FIG. 38 is a plan view showing a 5-terminal interconnectable star coupler implemented on a substrate as an optical integrated circuit, which is an embodiment of the invention.

The structure of the 4-terminal half coupler, the 4-terminal full coupler, and the 8-terminal full coupler shown in FIGS. 38, 42, 44 is, as disclosed in the specification of Japanese Patent Application No. 409070/1990, can be implemented by a method of forming an optical waveguide by diffusing thallium (Tl) ions, etc., on a glass substrate, a method of forming an optical waveguide while injecting ultraviolet rays onto polycarbonate for selective polymerization and thereby preparing a distribution of refractive indices, a method of combining fused couplers, or the like.

Figure 45:
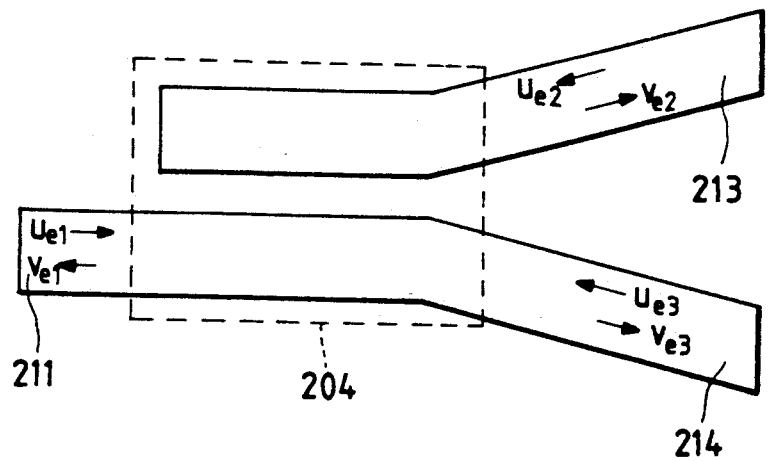
FIG. 45 is a plan view of a 1×2 optical unequally distributing/synthesizing unit using a directional coupler based on coupled mode theory.
Figure 46:
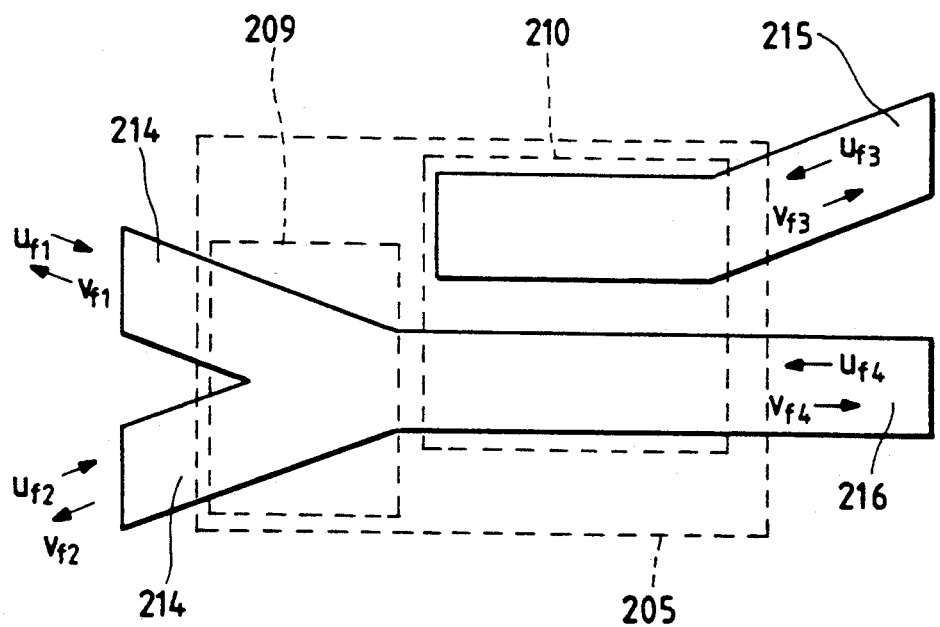
FIG. 46 is a plan view of a 2×2 optical unequally distributing unit using a directional coupler based on coupled mode theory.
Figure 47:
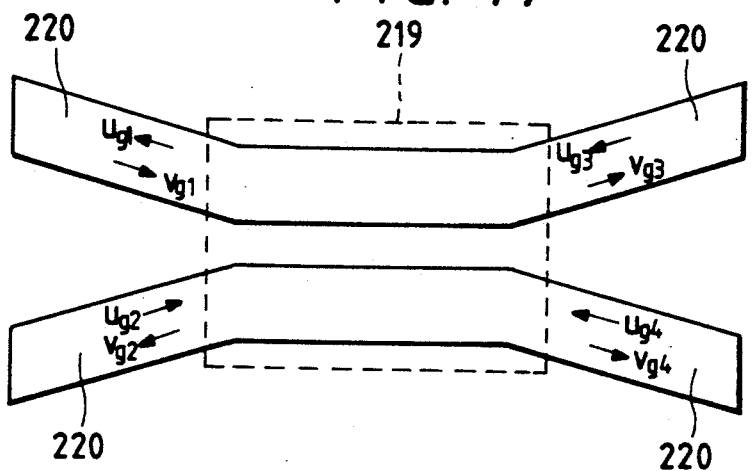
FIG. 47 is a plan view of a 2×2 optical equally distributing unit using a directional coupler based on coupled mode theory.

A part or all of the components of the half and full couplers may also be implemented using directional couplers. That is, in place of the distributing units shown in FIGS. 39, 40, 43, the directional couplers such as shown in FIGS. 45, 46, 47 may be used. Reference characters $u_{e1}$ to $u_{e3}$, $u_{f1}$ to $u_{f4}$, $u_{g1}$ to $u_{g4}$ designate optical input signals and $v_{e1}$ to $v_{e3}$, $v_{f1}$ to $v_{f4}$, $v_{g1}$ to $v_{g4}$ designate optical output signals.

In the case where the optical waveguide is formed by diffusing thallium (Tl) ions, etc., on a glass substrate, it is easier to utilize directional couplers based on coupled mode theory. Since it is difficult to form different-diameter waveguides on the same glass substrate with this technique, it is difficult to form an optical unequally distributing/synthesizing unit with a structure as shown in FIGS. 39 and 40.

Figure 48:
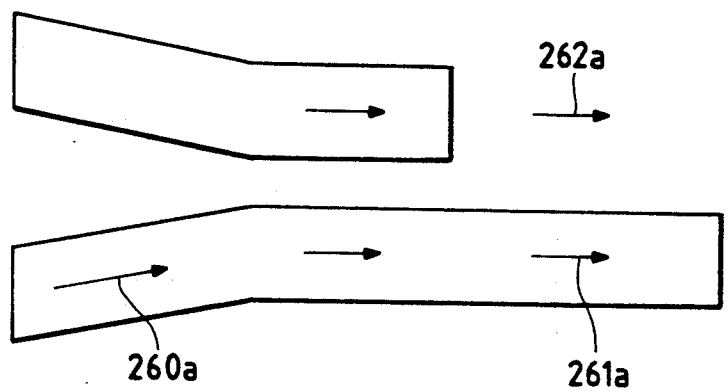
FIG. 48 is a diagram showing that optical signal loss is produced to an input optical signal from a main optical waveguide in an optical synthesizing unit using a directional coupler based on coupled mode theory.
Figure 49:
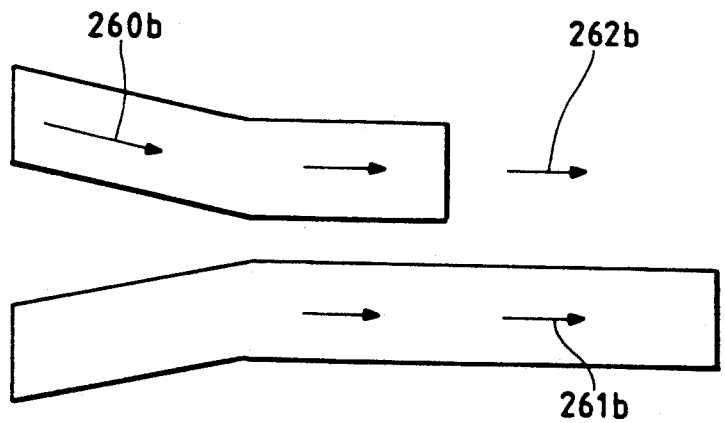
FIG. 49 is a diagram showing that optical signal loss is produced to an input optical signal from an auxiliary optical waveguide in an optical synthesizing unit using a directional coupler based on coupled mode theory.

In the case of using polycarbonate, it is difficult to fabricate an optical unequally distributing/synthesizing unit whose distribution ratio exceeds 20. In contrast thereto, the use of directional couplers based on coupled mode theory may allow such a distribution ratio as 50 or 100 to be implemented. This is important from a practical viewpoint, because the foregoing description has obscured the absorption loss and radiation loss of the optical waveguides and optical fibers, or the connection loss of the optical connectors, etc., but taking these losses into account, the distribution coefficient a of the half coupler shown in equation (5) must be smaller than that when no consideration is given to the losses. However, when directional couplers based on coupled mode theory are used, the distribution ratio of the optical signal of each component must be redesigned. The reason for this is that the use of the directional couplers based on coupled mode theory involves intrinsic losses that are not found in the structure shown in FIGS. 39 and 40. That is, as shown in FIGS. 48 and 49, loss components 262a, 262b of optical signals exist with respect to input optical components 260a, 260b, in addition to effective output optical components 261a, 261b.

Figure 50:
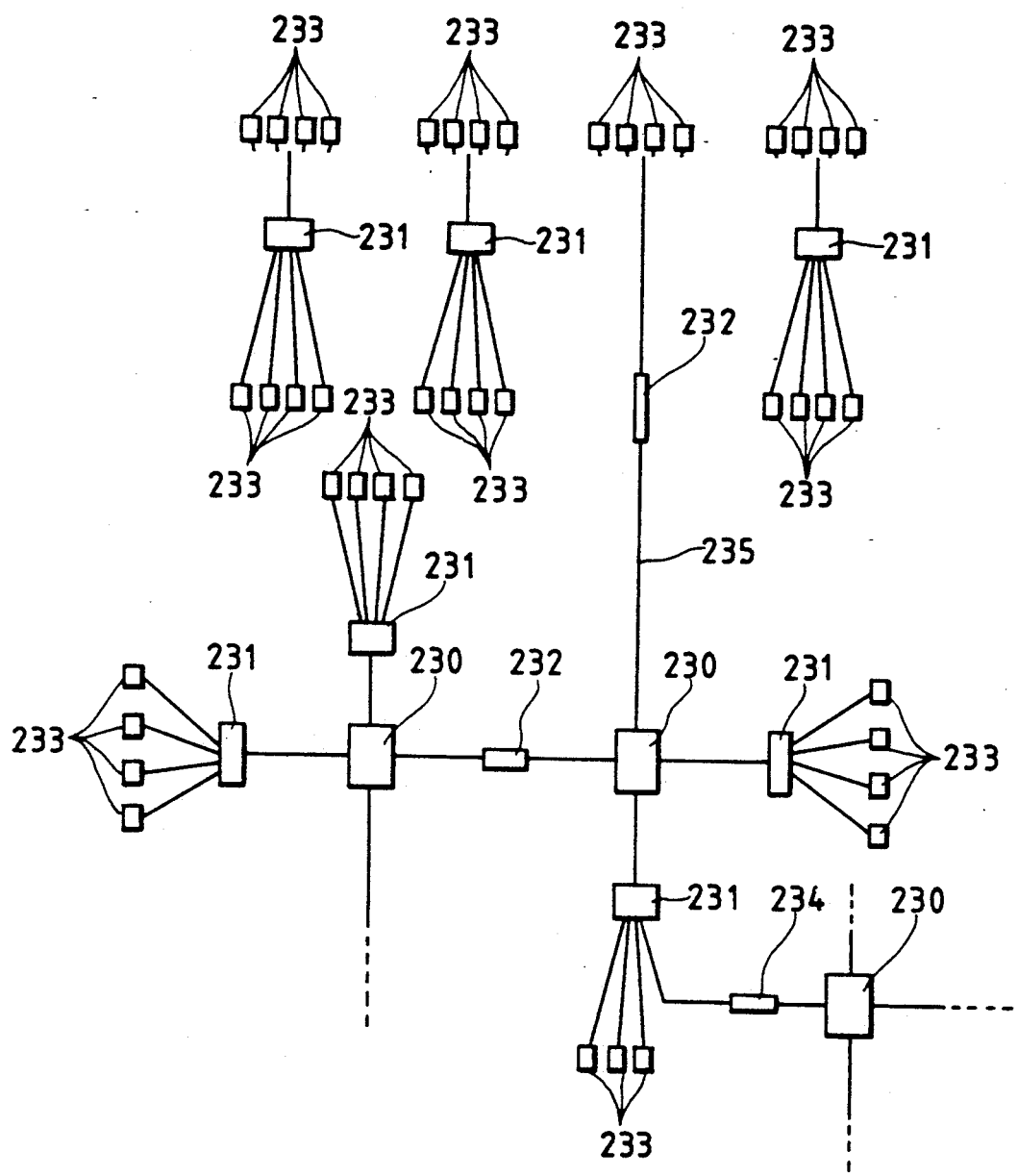
FIG. 50 is a diagram showing an exemplary optical communication network configured by combining 4-terminal interconnectable star couplers and 4-terminal interconnectable star couplers whose transfer matrix to other terminals are substantially equal of the invention.

FIG. 50 shows an exemplary optical communication network configured by combining 4-terminal half couplers 231, each having the FIG. 38 structure, and 4-terminal full couplers 230, each having the FIG. 42 structure. The transfer characteristic of each 4-terminal half coupler 231 is the one shown in equation (21). Nodes 233 are connected to each 4-terminal full coupler 230 through its corresponding 4-terminal half coupler 231. The term "node" herein used means a workstation, a file server, a printer, and the like. The 4-terminal full couplers 230 are interconnected through link amplifiers 232. Each link amplifier 232 is a bidirectional optical amplifier or a reproducing link amplifier such as a semiconductor laser amplifier or a rare earth element-doped fiber amplifier. For rare earth element-doped fiber amplifiers, see "Optical Fiber Amplifiers" by Horiguchi (Kogaku, Vol. 19, No. 5, pp. 276–282), and for semiconductor laser amplifiers, see "Studies on Semiconductor Laser Amplifiers Used In Optical Communication Systems" by Shimada and Nakagawa (O plus E, August 1989, pp. 106–111).

The half coupler 231 can be connected to the 4-terminal full coupler 230 through a link amplifier 234. In this case, the link amplifier 234 must have a higher gain than the link amplifier 232. In an ideal condition with no losses other than distribution loss, the gain required of the link amplifier 232 is (m−1) times as large, while the gain required of the link amplifier 234 is (nm−1) times as large, resulting in a gain difference of about n. In configuring a network, the components must not be connected so as to form a closed loop in a network, as described in the specification of Japanese Patent Application No. 409070.1990.

Figure 51:
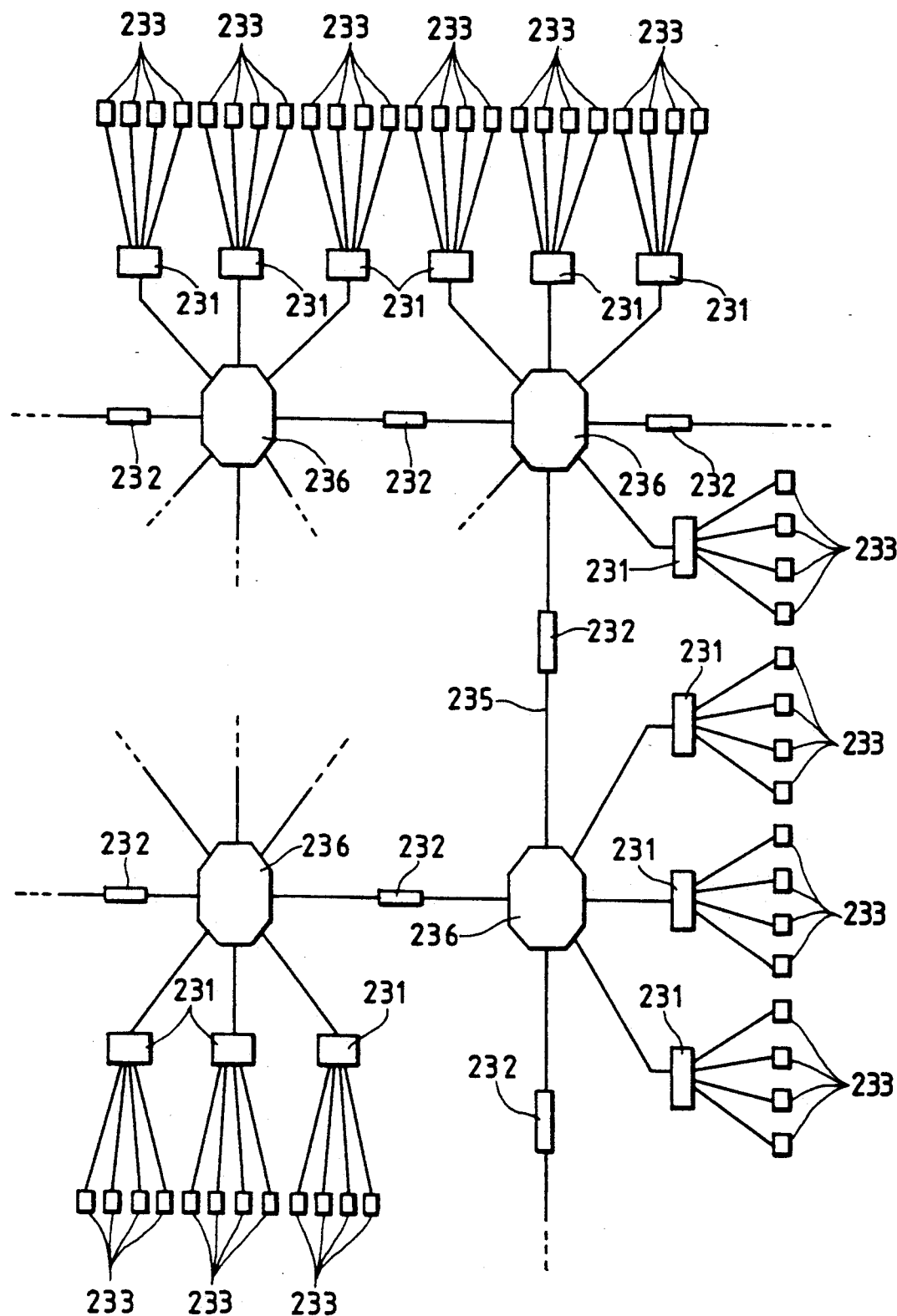
FIG. 51 is a diagram showing an exemplary optical communication network configured by combining 4-terminal half couplers and 8-terminal full couplers whose transfer characteristic to other terminals are substantially equal of the invention.
Figure 52:
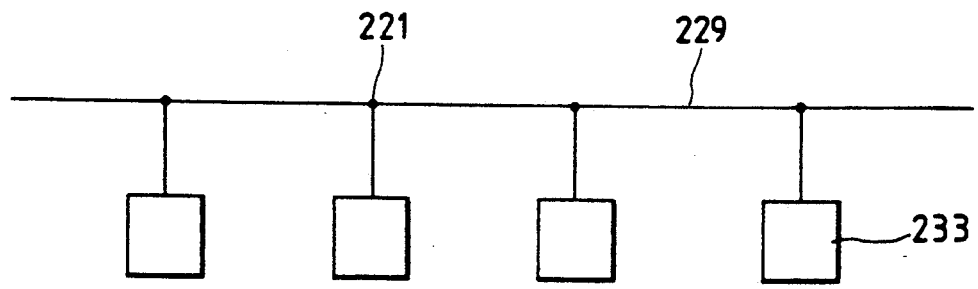
FIG. 52 is a diagram showing an exemplary configuration of a general network.
Figure 53:
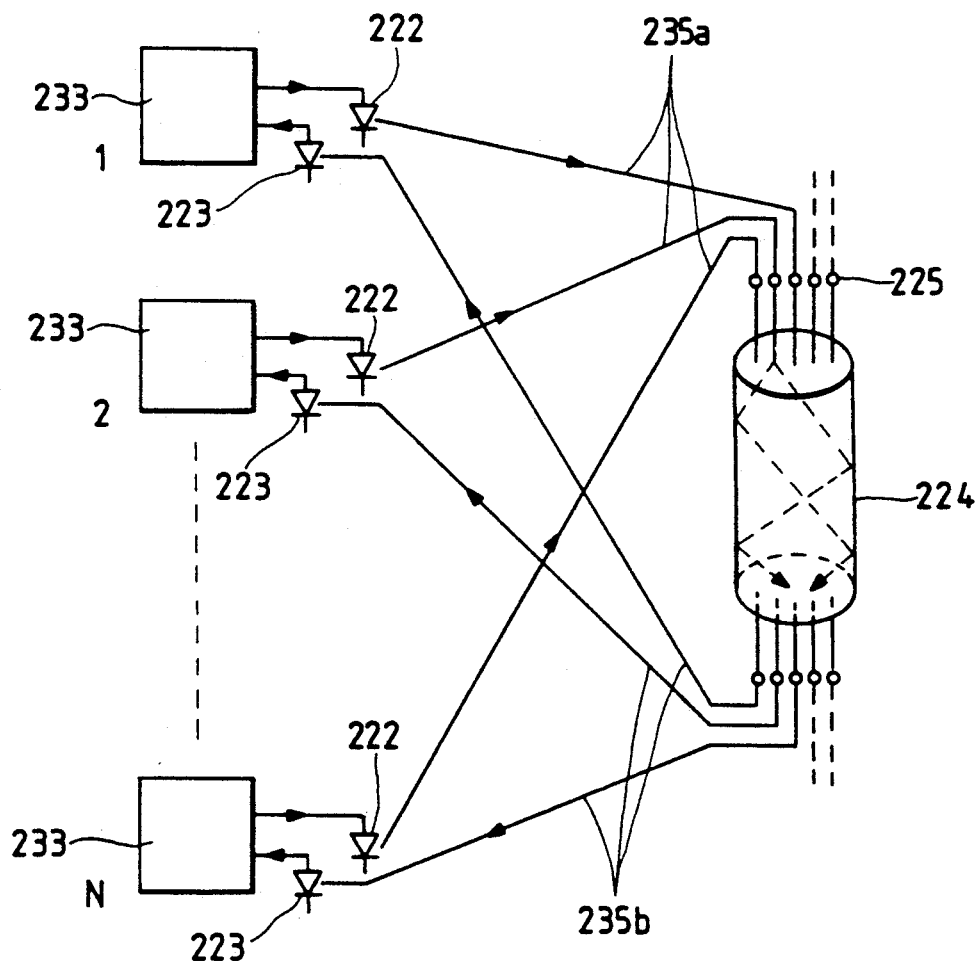
FIG. 53 is a diagram showing an exemplary network configured by using conventional star couplers.
Figure 54:
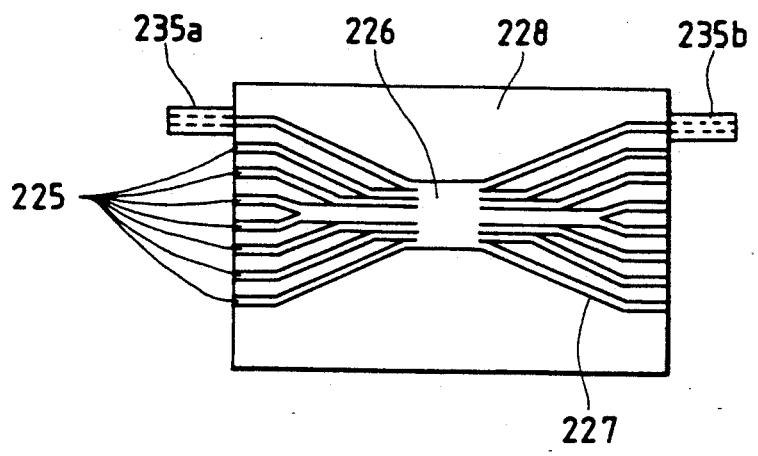
FIG. 54 is a plan view showing a conventional star coupler implemented on a glass substrate.
Figure 55:
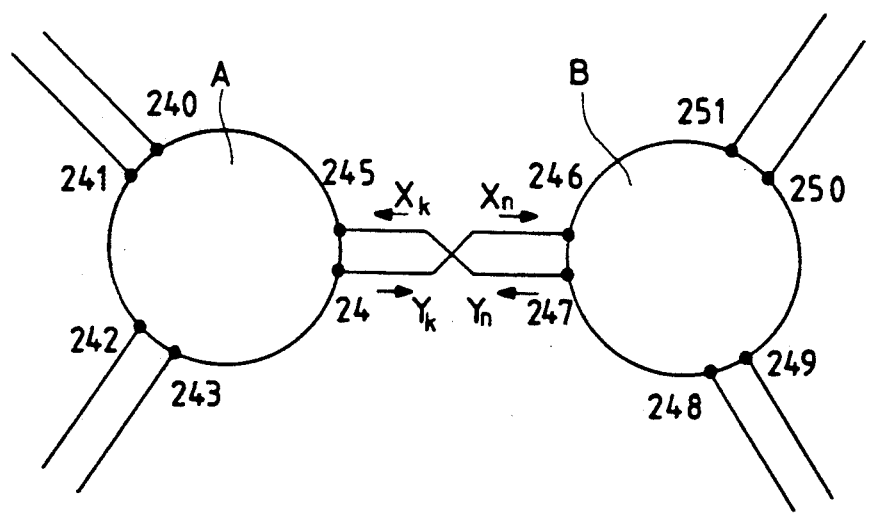
FIG. 55 is a diagram schematically showing a configuration by connecting two star couplers.
Figure 56:
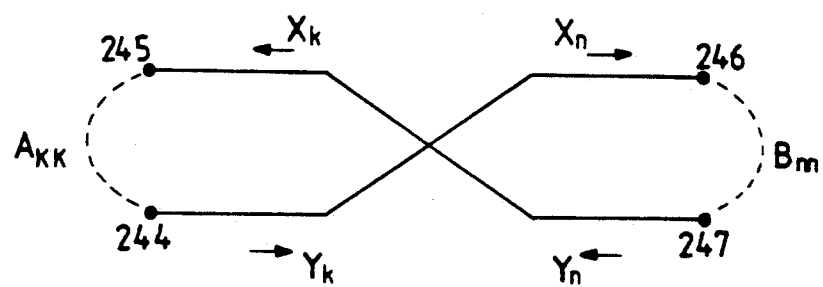
FIG. 56 is a diagram showing circulation of a signal when the two conventional star couplers are connected.

FIG. 51 shows an exemplary optical communication network configured by combining the 4-terminal half couplers 231, each having the FIG. 38 structure, and the 8-terminal full couplers 236, each having the FIG. 44 structure. The transfer characteristic of each 4-terminal half coupler 231 is the one shown in equation (22) unlike the embodiment shown in FIG. 50. The link amplifier 232 must have a higher gain compared to the case shown in FIG. 50. Other aspects of the configuration is the same as those shown in FIG. 50.

As described above, the invention uses a combination of a star coupler having the unequal transfer characteristic and a star coupler having the equal transfer characteristic, so that star couplers with a smaller number of terminals can be used. Therefore, a large-scale network can be configured using star couplers having a smaller number of terminals, such star couplers being fabricated easily. The addition of star couplers enables the network to be easily expanded, thereby contributing to curtailing the amount of an initial investment.

Figure 57:
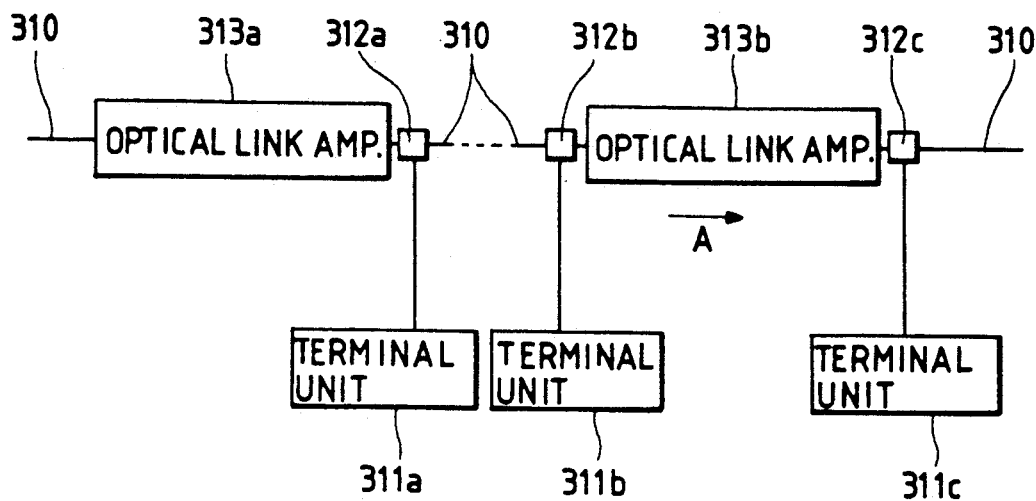
FIG. 57 is a schematic diagram showing an exemplary configuration of an ordinary optical communication network using optical link amplifiers.

When an optical path is long in an optical communication network, optical amplifiers must be arranged along the path to compensate for attenuation of an optical signal. FIG. 57 shows an example of an ordinary optical communication network using such optical amplifiers. A plurality of terminal units 311a, 311b 311c are connected to an optical transmission path 310 made of, e.g., an optical fiber for transmitting an optical signal through couplers 312a, 312b, 312c, respectively, and optical link amplifiers 313a, 313b for compensating for optical signal attenuation are inserted at predetermined points along the optical transmission path 310.

Typical optical amplifiers used as optical link amplifiers include: a semiconductor laser optical amplifier and a rare earth element-doped optical fiber amplifier.

Semiconductor laser optical amplifiers use an ordinary semiconductor laser as an optical amplifier element as it is, or operate a semiconductor laser as a traveling-wave optical amplifier by applying reflection-preventing films on both faces thereof (see, e.g., Mochizuki: "Semiconductor Laser Optical Amplifiers", Kogaku, Vol. 18, No. 6, (June 1989), pp. 297–302). Rare earth element-doped optical fiber amplifiers irradiate an excited beam from an exciting beam source such as a laser onto the optical fiber into which a rare earth element has been doped, and thus amplifies an input beam by keeping the optical fiber excited (see. e.g, Horiguchi: "Optical Fiber Amplifiers", Kogaku, Vol. 19, No. 5 (May 1990), pp. 276–282).

The semiconductor laser optical amplifier is disadvantageous in that it exhibits a larger coupling loss with optical fibers than the rare earth element-doped optical fiber amplifier and that it is subjected to a large loss when current injection is stopped. That is, the rare earth element-doped optical fiber can pass a signal beam to some extent even if the excited beam source, which is a source for amplification, is isolated, allowing the insertion loss to be maintained within 5-dB or so as long as the amplifier is well designed. In contrast thereto, the semiconductor laser optical amplifier exhibits a larger coupling loss with fibers, with an average insertion loss of 10 dB or so including an internal loss of the amplifier. The insertion loss is increased by 5 to 10 dB, resulting in a total of 15 to 20 dB when the amplifier operation is stopped.

For example, if the internal gain is 23 dB, the effective gain is 13 dB (23−10) (a gain of 20) in a normal condition, while the effective gain is −15 dB (1/31.6) in an abnormal condition, causing the output to attenuate by 38 dB (1/6300) during abnormality compared to that in the normal condition.

For the above reason, the semiconductor laser optical amplifier is disadvantageous in ensuring the communication path at the time of trouble, i.e., the semiconductor laser optical amplifier is unsatisfactory from the viewpoint of fail-safe function compared to the rare earth element-doped optical fiber amplifier, although the semiconductor laser amplifier is advantageous in terms of its element structure that is small and in terms of its flexible capabilities with an extensive range of amplifiable wavelengths and a wide band for selected wavelengths.

Let it be assumed that, in the optical communication network shown in FIG. 57, an optical signal is transmitted in a direction indicated by an arrow A. For example, the optical link amplifier 313b failed, an output from the optical link amplifier 313b becomes 1/6300 its input. Once thus attenuated, terminal units subsequent to the optical link amplifier 313b, e.g., the terminal unit 11c, can no longer receive an optical signal of sufficient level, leading to a grave malfunction of the optical communication network.

The optical link amplifier of the invention outputs an input signal light from the optical synthesizing unit after the input beam has been sufficiently amplified by the optical amplifier when the optical amplifier is operating normally. Since the output beam from the optical amplifier is sufficiently large compared to a signal beam having passed through the bypass optical waveguide, interaction between both beams through their interference may be negligible. When some trouble happens at the optical amplifier, the input signal light passes through the bypass optical waveguide and is outputted from the optical synthesizing unit. If the distribution ratio is, e.g., 1:1, an output half the input signal light can be obtained, hence allowing subsequent terminal unit(s) to be supplied with a minimally required signal light and maintaining the functions of the optical communication network integral. In addition, the output beam from the optical amplifier that is inoperative is sufficiently small compared to the signal light having passed through the bypass optical waveguide, so that their interaction by interference is negligible.

An embodiment of the amplifier will be described in detail with reference to the drawings.

Figure 58:
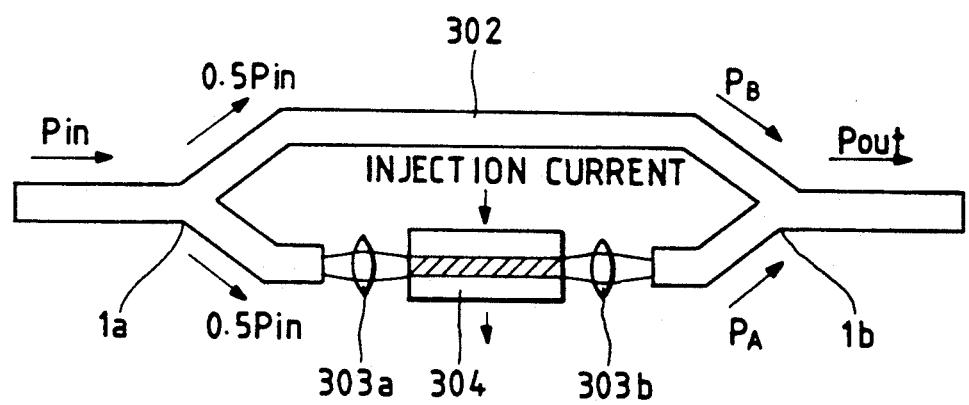
FIG. 58 is a schematic diagram showing an exemplary configuration of an optical link amplifier of the invention.

FIG. 58 schematically shows an exemplary configuration of an optical link amplifier of the invention. An input signal beam is distributed into two equal light beams by an optical distributing unit 301a, and one of the distributed input signal beams is supplied to a bypass optical waveguide 302, while the other light beam is applied to a semiconductor laser amplifier 304 through a combined lens 303a. Since the semiconductor laser amplifier 304 is disclosed in publications such as "Studies on Semiconductor Laser Amplifiers Used In Optical Communication Systems" (Shimada and Nakagawa: O plus E, No. 117, August 1989, pp. 106-111), its detailed description will be omitted.

The light beam amplified by the semiconductor laser amplifier 4 is applied to one of the input terminals of an optical synthesizing unit 1b through a combined lens 303b. The light beam having passed through the bypass optical waveguide 302 is applied to the other input terminal of the optical synthesizing unit 301b. As a result, both light beams are synthesized. The optical distributing unit 301a and the optical synthesizing unit 301b are identical in structure.

If the amplifier is thus constructed, the problem of interference of light beams arising from the two different optical paths will have to be taken care of since the signal light beam is generally a laser beam which is coherent. However, when the semiconductor laser amplifier is used, its large insertion loss causes few interference. The following will account for this in detail.

If it is assumed that the injected power of a signal light is Pin, the signal beam is divided into two beams by the optical distributing unit 1a, each having an injected power of 0.5 Pin, and the lights are distributed to both the bypass optical waveguide 302 and the semiconductor laser amplifier 304.

During normal operation, the semiconductor laser amplifier 304 keeps its internal gain exceeding its insertion loss. If, e.g., the insertion loss is 10 dB and the internal gain is 23 dB, the effective gain becomes 13 dB. Therefore, the signal light $P_A$ having passed through the semiconductor laser amplifier 304 is amplified to a value 20 times as large L as the input power, thus having a power of 10 Pin. On the other hand, the signal light $P_B$ having passed through the bypass optical waveguide 302 has only 0.5 Pin. A signal light Pout obtained by synthesizing both beams can be expressed as follows:

$$P_A - P_B \leq \text{Pout} \leq P_A + P_B \qquad (23)$$

$$0.5 \text{ Pin} \leq \text{Pout} \leq 10.5 \text{ Pin} \qquad (24)$$

In the above equations, "$P_A - P_B$" is obtained when both beams are in opposite phase to each other, while "$P_A + P_B$" is obtained when both beams are in phase.

Let us consider the condition in which current injection to the semiconductor laser amplifier 304 is interrupted during an abnormal operation. Under such condition, $P_A$ becomes 0.05 Pin. Therefore, Pout becomes as follows from equation (23).

$$-0.45 \text{ Pin} \leq \text{Pout} \leq 0.55 \text{ Pin} \qquad (25)$$

As indicated above, $P_A > P_B$ during normal operation and $P_A < P_B$ during abnormal operation. Thus, the influence of interference can be neglected.

According to the above embodiment, the optical link amplifier serves as an amplifier with a gain of about 10 dB at the time of normal operation and as an attenuator with an insertion loss of about 3 dB at the time when some trouble happens. Thus, the signal beam can be transmitted to a subsequent stage with a power of −13 dB (1/20) with respect to the normal operation even at the time of abnormality. This much of attenuation is within the input dynamic range of a terminal unit, thus allowing the signal beam to be received normally by the subsequent terminal unit. That is, a fail-safe function can be implemented in the optical communication network.

While the case where the distribution ratio of the optical distributing unit 1a to the optical synthesizing unit 1b is 1:1 has been described, the distribution ratio of the invention is not limited thereto; other distribution ratios may, of course, be applied.

While an example of an optical link amplifier using a semiconductor laser amplifier has been described in the above embodiment, the invention is not limited thereto but may be applied to any type of optical link amplifier using an optical amplifier having a large insertion loss.

As described in the foregoing, the invention, which is configured so that a bypass optical waveguide is provided in parallel to an optical amplifier whose insertion loss is large such as a semiconductor laser amplifier having a large insertion loss, allows an optical signal to pass therethrough to some extent at the event of an optical amplifier trouble. Therefore, even if the optical amplifier has failed, the influence of the failure on the communication network can be reduced.

What is claimed is:

1. A star coupler comprising at least three terminals through which an optical signal is output and input, said star coupler having a transfer characteristic such that an input signal which is initially inputted to one of said terminals is distributed as an output signal to all terminals other than said terminal to which the input signal is inputted initially, said star coupler including a substrate and an optical waveguide region formed by a changed refractive index of a part of said substrate, each of said terminals being connected to each other through said optical waveguide region.

2. A star coupler as defined in claim 1 wherein three terminals for receiving and outputting the optical signal are provided, and said star coupler comprising: three directional optical couplers; optical waveguides interposed between said terminals and said directional optical couplers; and optical waveguides formed between said directional optical couplers.

3. An optical communication network comprising a plurality of star couplers, each of said star couplers having a plurality of terminals through which an optical signal is output and input, said star coupler having such a transfer characteristic that an input signal which is initially inputted to one of said terminals is distributed as an output signal to all terminals other than said terminal to which the input signal is inputted initially, and said star couplers being coupled to each other through said terminals, each of said star couplers including a substrate and an optical waveguide region formed by a changed refractive index of a part of said substrate, each of said terminals being connected to each other through said optical waveguide region.

4. A star coupler comprising at least three terminals through which an optical signal is output and input, said star coupler having such a transfer characteristic that an input signal is distributed as an output signal to all terminals other than said terminal to which the input signal is inputted initially, and wherein said transfer characteristic is selected so that the optical signal inputted from a specific single terminal is distributed substantially equally to all terminals other than the specific single terminal and a distribution ratio of an optical signal inputted from a terminal other than the specific single terminal to the specific single terminal is larger than the distribution ratio of the optical signal to each of the other terminals, said star coupler including a substrate and an optical waveguide region formed by a changed refractive index of a part of said substrate, each of said terminals being connected to each other through said optical waveguide region.

5. An optical communication network comprising a plurality of star couplers, each star coupler being provided with at least three terminals through which an optical signal is output and input, said star coupler having such a transfer characteristic that an input signal which is initially inputted to one of said terminals is distributed as an output signal to all terminals other than said terminal to which the input signal is inputted initially, each of said star couplers including a substrate and optical waveguide region formed by a changed refractive index of a part of said substrate, each of said terminals being connected to each other through said optical waveguide region and wherein said transfer characteristic is selected so that the optical signal inputted from a specific single terminal is distributed substantially equally to all terminals other than the specific single terminal and a distribution ratio of an optical signal inputted from a terminal other than the specific single terminal to the specific single terminal is larger than the distribution ratio of the optical signal to each of the other terminals.

6. An optical link amplifier comprising: an optical distributing means for distributing an input signal light into a plurality of light beams; an amplifier for optically amplifying, without electrical conversion, one of said distributed input signal lights; a bypass optical wave guide for allowing the other one of said distributed input signal beams to pass therethrough; and an optical synthesizing means for synthesizing an output beam from said amplifier with said beams having passed through said bypass optical waveguide.

7. An optical coupler comprising an optical distributing/synthesizing device, said device including three optical distributing/synthesizing means, each of said three optical distributing/synthesizing means having a single input/output path and two distributing paths for distributing said input/output path, one of said two distributing paths of said optical distributing/synthesizing means is optically coupled to one of said two distributing paths of said different optical distributing/synthesizing means without intersecting each other, two distributing paths of each of said optical distributing/synthesizing means being two equally distributing paths distributing an optical signal into substantially equally distributed signal, said optical distributing/synthesizing device having a substrate, each of said optical distributing/synthesizing means and each of said paths being an optical waveguide region formed by a changed refractive index of a part of said substrate.

8. An optical coupler comprising an optical distributing/synthesizing device, said device including three optical distributing/synthesizing means, each of said three optical distributing/synthesizing means having a single input/output path and two distributing paths for distributing said input/output path, one of said two distributing paths of each of said three optical distributing/synthesizing means is optically coupled to one of said two distributing paths of said different optical distributing/synthesizing means without intersecting each other, two distributing paths of two of said three optical distributing/synthesizing means being two unequally distributing paths distributing an optical signal into unequally distributed signals, while said two distributing paths of the remaining one of said three optical distributing/synthesizing means being two equally distributing paths distributing an optical signal into substantially equally distributed signals, said optical distributing/synthesizing device having a substrate, each of said optical distributing/synthesizing means and each of said paths being an optical waveguide region formed by a changed refractive index of a part of said substrate.

9. An optical coupler according to claim 7, further comprising an optical distributing/synthesizing device, said device including three optical distributing/synthesizing means, each of said three optical distributing/synthesizing means having a single input/output path and two distributing paths for distributing said input/output path, one of said two distributing paths of each of said three optical distributing/synthesizing means is optically coupled to one of said two distributing paths of said different optical distributing/synthesizing means without intersecting each other, two distributing paths of two of said three optical distributing/synthesizing means being two unequally distributing paths distributing an optical signal into unequally distributed signals, while said two distributing paths of the remaining one of said three optical distributing/synthesizing means being two equally distributing paths distributing an optical signal into substantially equally distributed signals, and wherein said both optical distributing/synthesizing devices are interconnected by optically coupling any ones of said input/output paths.

10. An optical coupler as defined in claim 8, further comprising an optical distributing/synthesizing device, said device including three optical distributing/synthesizing means, each of said three optical distributing/synthesizing means having a single input/output path and two distributing paths for distributing said input/output path, one of said two distributing paths of said optical distributing/synthesizing means is optically coupled to one of said two distributing paths of said different optical distributing/synthesizing means without intersecting each other, two distributing paths of each of said optical distributing/synthesizing means being two equally distributing paths distributing an optical signal into substantially equally distributed signals, and wherein said both optical distributing/synthesizing devices are interconnected by optically coupling any ones of said input/output paths.

11. An optical coupler as defined in claim 7 wherein a transfer characteristic of said signals is expressed by $$\begin{bmatrix} W_1 \\ W_2 \\ \cdot \\ \cdot \\ \cdot \\ W_N \end{bmatrix} = \begin{bmatrix} 0 & m_{12} & \ldots & m_{1N} \\ m_{21} & 0 & \ldots & m_{2N} \\ \cdot & & & \cdot \\ \cdot & & & \cdot \\ \cdot & & & \cdot \\ m_{N1} & m_{N2} & \ldots & 0 \end{bmatrix} \begin{bmatrix} v_1 \\ v_2 \\ \cdot \\ \cdot \\ \cdot \\ v_N \end{bmatrix}$$

where $X_1, X_2, \ldots, X_N$ designate input/output terminals, $V_1, V_2, \ldots, V_N$ are the input signals to said respective terminals and $W_1, W_2, \ldots, W_N$ are the output signals thereof.

12. An optical coupler as defined in claim 9 wherein a transfer characteristic of said signals is expressed by $$\begin{bmatrix} W_1 \\ W_2 \\ \cdot \\ \cdot \\ \cdot \\ W_N \end{bmatrix} = \begin{bmatrix} 0 & m_{12} & \ldots & m_{1N} \\ m_{21} & 0 & \ldots & m_{2N} \\ \cdot & & & \cdot \\ \cdot & & & \cdot \\ \cdot & & & \cdot \\ m_{N1} & m_{N2} & \ldots & 0 \end{bmatrix} \begin{bmatrix} v_1 \\ v_2 \\ \cdot \\ \cdot \\ \cdot \\ v_N \end{bmatrix}$$

where $X_1, X_2, \ldots, X_N$ designate input/output terminals, $V_1, V_2, \ldots, V_N$ are the input signals to said respective terminals and $W_1, W_2, \ldots, W_N$ are the output signals thereof.

13. An optical coupler as defined in claim 10 wherein a transfer characteristic of said signals is expressed by $$\begin{bmatrix} W_1 \\ W_2 \\ \cdot \\ \cdot \\ \cdot \\ W_N \end{bmatrix} = \begin{bmatrix} 0 & m_{12} & \ldots & m_{1N} \\ m_{21} & 0 & \ldots & m_{2N} \\ \cdot & & & \cdot \\ \cdot & & & \cdot \\ \cdot & & & \cdot \\ m_{N1} & m_{N2} & \ldots & 0 \end{bmatrix} \begin{bmatrix} v_1 \\ v_2 \\ \cdot \\ \cdot \\ \cdot \\ v_N \end{bmatrix}$$

where $X_1, X_2, \ldots, X_N$ designate input/output terminals, $V_1, V_2, \ldots, V_N$ are the input signals to said respective terminals and $W_1, W_2, \ldots, W_N$ are the output signals thereof.

14. An optical coupler as defined in claim 9 wherein an optical signal is inputted to and outputted from said input/output path and a distribution ratio of said unequally distributing paths is selected so that said optical coupler has such a transfer characteristic that an input signal to an initially inputted/outputted path is not distributed as an output signal from said initially inputted/outputted path but that said input signal is distributed as output signals to all input/output paths other than said initially inputted/outputted path.

15. An optical coupler as defined in claim 10 wherein an optical signal is inputted to and outputted from said input/output path and a distribution ratio of said unequally distributing branch is selected so that said optical coupler has such a transfer characteristic that an input signal to an initially inputted/outputted path is not distributed as an output signal from said initially inputted/outputted path but that said input signal is distributed as output signals to all input/output paths other than said initially inputted/outputted path.

16. An optical coupler as defined in claim 9 further comprising link amplifying means.

17. An optical coupler as defined in claim 16 wherein said link amplifying means is a rare earth element-doped fiber amplifier.

18. An optical coupler as defined in claim 16 wherein said link amplifying means is a semiconductor laser amplifier.

19. An optical coupler as defined in claim 10 further comprising link amplifying means.

20. An optical coupler as defined in claim 19 wherein said link amplifying means is a rare earth element-doped fiber amplifier.

21. An optical coupler as defined in claim 19 wherein said link amplifying means is a semiconductor laser amplifier.

22. An optical coupler comprising an optical distributing/synthesizing device, said device having a single first input/output path and a plurality of second input/output paths, said first input/output path being connected to said plurality of second input/output paths through a plurality of unequally distributing branches distributing an optical signal unequally, said optical distributing/synthesizing device having a substrate, each of said paths being an optical waveguide region formed by a changed refractive index of a part of said substrate, and wherein a transfer characteristic of said signals is expressed by the following equation:

$$\begin{bmatrix} y_0 \\ y_1 \\ y_2 \\ \cdot \\ \cdot \\ \cdot \\ y_n \end{bmatrix} = \begin{bmatrix} 0 & b & b & \ldots & b \\ c & 0 & a & \ldots & a \\ c & a & 0 & \ldots & a \\ \cdot & & & & \cdot \\ \cdot & & & & \cdot \\ \cdot & & & & \cdot \\ c & a & a & \ldots & 0 \end{bmatrix} \begin{bmatrix} x_0 \\ x_1 \\ x_2 \\ \cdot \\ \cdot \\ \cdot \\ x_n \end{bmatrix}$$

where P0 is said first input/output path, P1, P2, ..., Pn are said plurality of second input/output paths and X0, X1, X2, ..., Xn, and Y0, Y1, Y2, ..., Yn are the input and output signals corresponding to P0, P1, P2, ..., $P_{nx0}$.

23. An optical coupler according to claim 22 wherein a distribution ratio of said unequally distributing paths is selected so that an input signal inputted from said first input/output path is distributed to said plurality of second input/output paths substantially equally and that a distribution ratio of an optical signal inputted from an arbitrary one of said plurality of second input/output paths to said first input/output path becomes larger than said distribution ratio of said second input/output paths.

24. An optical coupler as defined in claim 7 further comprising an optical distributing/synthesizing device, said device having a single first input/output path and a plurality of second input/output paths, said first input- /output path being connected to said plurality of second input/output paths through a plurality of unequally distributing branch distributing an optical signal unequally, said first input/output path being optically coupled to an arbitrary one of said input/output paths.

25. An optical coupler according to claim 9 further comprising an optical distributing/synthesizing device, said device having a single first input/output path and a plurality of second input/output paths, said first input/output path being connected to said plurality of second input/output paths through a plurality of unequally distributing branch distributing an optical signal unequally, said first input/output path being optically coupled to an arbitrary one of said input/output paths.

26. An optical coupler according to claim 10 further comprising an optical distributing/synthesizing device, said device having a single first input/output path and a plurality of second input/output paths, said first input/output path being connected to said plurality of second input/output paths through a plurality of unequally distributing branch distributing an optical signal unequally, said first input/output path being optically coupled to an arbitrary one of said input/output paths.

27. An optical coupler comprising a plurality of star couplers interconnected to each other, each of said star couplers including at least three terminals through which an optical signal is output and input and having a transfer characteristic such that an input signal which is initially inputted to one of said terminals is distributed as an output signal to all terminals other than said terminal to which the input signal is inputted initially, each of said star couplers including a substrate and an optical waveguide region formed by a changed refractive index of a part of said substrate, each of said terminals being connected to each other through said optical waveguide region.

28. An optical communication network comprising:
a plurality of star couplers, each containing at least three terminals through which an optical signal is output and input and having a transfer characteristic such that an input signal which is initially inputted to one of said terminals is distributed as an output signal to all terminals other than said terminal to which the input signal is inputted initially, each of said star couplers including a substrate and an optical waveguide region formed by a changed refractive index of a part of said substrate, each of said terminals being connected to each other through said optical waveguide region; and
a link amplifier means for interconnecting said star couplers.

29. An optical communication network claimed in claim 28, wherein said link amplifier means is an optical amplifier.

30. An optical coupler comprising an optical distributing/synthesizing device, said device including three optical distributing/synthesizing means, each of said optical distributing/synthesizing means having a single input/output path and two distributing paths, one of said distributing paths of each optical distributing/synthesizing means being optically coupled to one distributing path of another optical distributing/synthesizing means without intersecting each other, said optical distributing/synthesizing device having a substrate, each of said optical distributing/synthesizing means and each of said paths being an optical waveguide region formed by a changed refractive index of a part of said substrate.

31. A optical coupler claimed in claim 30, wherein said distributing paths of each optical distributing/synthesizing means are selected from the group consisting of an unequally distributing path and an equally distributing path.

32. An optical coupler comprising an optical distributing/synthesizing device, said device including a plurality of optical distributing/synthesizing means, each of said optical distributing/synthesizing means having a single input/output path and a plurality of distributing paths for distributing an optical path signal into a plurality of optical signals, one of said distributing paths of each optical distributing/synthesizing means being optically coupled to one distributing path of another optical distributing/synthesizing means, said optical distributing/synthesizing device having a substrate, each of said optical distributing/synthesizing means and each of said paths being an optical waveguide region formed by a changed refractive index of a part of said substrate.

33. An optical coupler claimed in claim 32, wherein said distributing paths of each optical distributing/synthesizing means are selected from the group consisting of an unequally distributing path and an equally distributing path.

34. An optical communication network comprising:
a first optical distributing/synthesizing device including a plurality of optical distributing/synthesizing means, each of said optical distributing/synthesizing means having a single input/output path and a plurality of distributing path means having a single input/output path and a plurality of distributing paths for distributing an optical signal into a plurality of optical signals, one of said distributing paths of each optical distributing/synthesizing means being optically coupled to one distributing path of another optical distributing/synthesizing means;
and a second optical distributing/synthesizing device including a single first input/output path and a plurality of second input/output paths, said first input/output path being connected to said plurality of second input/output paths through a plurality of unequally distributing branches, wherein said first optical distributing/synthesizing device and said second optical distributing/synthesizing device are optically interconnected to each other,
said first and second optical distributing/synthesizing devices each including a substrate, each of said optical distributing/synthesizing means and each of said paths being an optical waveguide region formed by a changed refractive index of a part of said substrates, respectively.

35. A star coupler comprising an optical distributing/synthesizing device including a substrate and a optical waveguide region formed by a changed refractive index of a part of said substrate, said optical distributing/synthesizing device including a plurality of distributing/synthesizing means, each of said plurality of distributing/synthesizing means having a single input/output path and a plurality of branch paths including a first branch path and a second branch path having a curve portion, said input/output path being optically coupled to said plurality of branch paths at a region in which said first branch path circumscribes said curve portion of said second branch path, each of said plurality of branch paths of said each optical distributing/synthesizing means being optically coupled to a different one of said branch paths of said optical distributing/synthesizing means and to each other.

36. A star coupler as defined in claim 35, wherein a branching ratio of said input/output path to each said branching paths is equal.

37. A star coupler as defined in claim 35, wherein a branching ratio of said input/output path to each said branching paths is unequal.

38. A star coupler as defined in claim 35, wherein an input signal inputted into an input/output path of an arbitrary optical distributing/synthesizing means of said plurality of optical distributing/synthesizing means is distributed to an input/output path of all said plurality of optical distributing/synthesizing means except said arbitrary optical distributing/synthesizing means at substantially equal density.

39. A star coupler as defined in claim 35, wherein said input/output path is an input/output terminal of the star coupler.

40. A star coupler as defined in claim 35, further comprising an optical fiber optically coupled to said input/output path.

41. A star coupler comprising a plurality of optical distributing/synthesizing devices, each including a substrate and a optical waveguide region formed by a changed refractive index of a part of said substrate, said optical distributing/synthesizing device including a plurality of distributing/synthesizing means, each of said plurality of distributing/synthesizing means having a single input/output path and a plurality of branch paths including a first branch path and a second branch path having a curve portion, said input/output path being optically coupled to said plurality of branch paths at a region in which said first branch path circumscribes said curve portion of said second branch path, each of said plurality of branch paths of said each optical distributing/synthesizing means being optically coupled to different one of said branch paths of said optical distributing/synthesizing means and to each other, each of said optical distributing synthesizing apparatus being optically coupled to each other through said input/output path.

* * * * *

UNITED STATES PATENT AND TRADEMARK OFFICE
CERTIFICATE OF CORRECTION

PATENT NO. : 5,282,257
DATED : January 25, 1994
INVENTOR(S) : Takeshi Ota

It is certified that error appears in the above-indentified patent and that said Letters Patent is hereby corrected as shown below:

Claim 4, Column 25, Line 27, after insert --which is initially inputted to one of said terminals--. (1st occurrence) *

Claim 5, Column 25, Line 51, after "and" insert --an--. *

Claim 6, Column 25, Line 67, change "wave guide" to --waveguide--.

Claim 7, Column 26, Line 18, change "signal" to --signals--. *

UNITED STATES PATENT AND TRADEMARK OFFICE
CERTIFICATE OF CORRECTION

PATENT NO. : 5,282,257
DATED : January 25, 1994
INVENTOR(S) : Takeshi Ota

It is certified that error appears in the above-indentified patent and that said Letters Patent is hereby corrected as shown below:

Claim 22, Column 28, Lines 41-50, Equation does not identically match original change "
$$\begin{bmatrix} y_0 \\ y_1 \\ y_2 \\ \cdot \\ \cdot \\ y_n \end{bmatrix} = \begin{bmatrix} 0 & b & b & \ldots & b \\ c & 0 & a & \ldots & a \\ c & a & 0 & \ldots & a \\ \cdot & \cdot & \cdot & & \cdot \\ \cdot & \cdot & \cdot & & \cdot \\ c & a & a & \ldots & 0 \end{bmatrix} \begin{bmatrix} x_0 \\ x_1 \\ x_2 \\ \cdot \\ \cdot \\ x_n \end{bmatrix}$$
"
to --
$$\begin{vmatrix} y_0 \\ y_1 \\ y_2 \\ \cdot \\ y_n \end{vmatrix} = \begin{vmatrix} 0 & b & b & \cdot\cdot & b \\ c & 0 & a & \cdot\cdot & a \\ c & a & 0 & \cdot\cdot & a \\ \cdot\cdot & \cdot\cdot & \cdot\cdot & \cdot\cdot & \cdot\cdot \\ c & a & a & \cdot\cdot & 0 \end{vmatrix} \begin{vmatrix} x_0 \\ x_1 \\ x_2 \\ \cdot\cdot \\ x_n \end{vmatrix}$$
--. *

Claim 32, Column 30, Line 11, after "optical" delete "path" *

UNITED STATES PATENT AND TRADEMARK OFFICE
CERTIFICATE OF CORRECTION

PATENT NO. : 5,282,257
DATED : January 25, 1994
INVENTOR(S) : Takeshi Ota

It is certified that error appears in the above-indentified patent and that said Letters Patent is hereby corrected as shown below:

Claim 35, column 30, line 56, change "a" to --an --.

Claim 41, column 32, line 6, change "a" to --an --;

Claim 41, column 32, line 19, change "different one" to --a different one-- or --different ones --.

Signed and Sealed this

Tenth Day of January, 1995

Attest:

BRUCE LEHMAN

*Attesting Officer*  *Commissioner of Patents and Trademarks*